(12) United States Patent
Sato

(10) Patent No.: US 10,734,495 B2
(45) Date of Patent: Aug. 4, 2020

(54) ELECTRONIC DEVICE, MANUFACTURING METHOD FOR ELECTRONIC DEVICE, AND ELECTRONIC APPARATUS

(71) Applicant: FUJITSU LIMITED, Kawasaki-shi, Kanagawa (JP)

(72) Inventor: Shintaro Sato, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 2 days.

(21) Appl. No.: 16/181,547

(22) Filed: Nov. 6, 2018

(65) Prior Publication Data

US 2019/0165120 A1 May 30, 2019

(30) Foreign Application Priority Data

Nov. 30, 2017 (JP) ................. 2017-229880

(51) Int. Cl.
| | | |
|---|---|---|
| *H01L 29/66* | (2006.01) | |
| *H01L 29/16* | (2006.01) | |
| *H01L 29/49* | (2006.01) | |
| *H01L 29/51* | (2006.01) | |
| *H01L 21/28* | (2006.01) | |
| *G01N 27/414* | (2006.01) | |
| *H01L 21/285* | (2006.01) | |
| *H01L 21/02* | (2006.01) | |
| *H01L 29/78* | (2006.01) | |
| *H01L 29/40* | (2006.01) | |

(Continued)

(52) U.S. Cl.
CPC ......... *H01L 29/49* (2013.01); *G01N 27/4141* (2013.01); *H01L 21/02126* (2013.01); *H01L 21/02216* (2013.01); *H01L 21/02219* (2013.01); *H01L 21/02271* (2013.01); *H01L 21/28026* (2013.01); *H01L 21/28525* (2013.01); *H01L 29/1606* (2013.01); *H01L 29/408* (2013.01); *H01L 29/51* (2013.01); *H01L 29/513* (2013.01); *H01L 29/66045* (2013.01); *H01L 29/78* (2013.01); *H01L 21/0272* (2013.01); *H01L 21/0274* (2013.01); *H01L 21/32136* (2013.01)

(58) Field of Classification Search
CPC .......... G01N 27/4141; H01L 29/66045; H01L 29/1606; H01L 29/408
See application file for complete search history.

(56) References Cited

U.S. PATENT DOCUMENTS

2018/0136157 A1  5/2018  Harada et al.

FOREIGN PATENT DOCUMENTS

| WO | 2014/030534 | 2/2014 |
| WO | 2017/002854 | 1/2017 |

OTHER PUBLICATIONS

Chandramohan, S. "A comparison of various surface charge transfer hole doping of graphene grown by chemical vapour deposition" App. Surf. Sci. 418, Jan. 16, 2017 pp. 258-263 (Year: 2017).*

(Continued)

*Primary Examiner* — Grant S Withers
(74) *Attorney, Agent, or Firm* — Fujitsu Patent Center

(57) ABSTRACT

An electronic device includes, a semiconductor layer, a source region and a drain region provided with the semiconductor layer to be interposed therebetween, a gate insulation film on the semiconductor layer between the source region and the drain region, and a gate of a graphene on the gate insulation film. The gate insulation film induces doping of charges in the graphene.

12 Claims, 19 Drawing Sheets

(51) Int. Cl.
*H01L 21/027* (2006.01)
*H01L 21/3213* (2006.01)

(56) References Cited

OTHER PUBLICATIONS

Qiao, H "Broadband Photodetector Based on Graphene-Bi2Te3 Heterostructure" ACS Nano vol. 9, No. 2 Jan. 2015 pp. 1886-1894 (Year: 2015).*
Luo, Z. "Controlled Doping of Graphene Using Ultraviolet Irradiation" App. Phys. Lett. 100, Jun. 20, 2012 pp. 253108-1 through 253108-4 (Year: 2012).*
Gabor, N. "Hot-Carrier-Assisted Intrinsic Photoresponse in Graphene" Science vol. 334 Nov. 4, 2011 pp. 648-651 (Year: 2011).*
Zhang, Y-H "Improving gas sensing properties of Graphene by introducing dopants and defects: a first-principles study" Nanotech. 20 Apr. 14, 2009 pp. 1-8 (Year: 2009).*

* cited by examiner

IN THE AIR

IN THE AIR    IN THE AIR

GRAPHENE SIDE

BASE INSULATION FILM SIDE

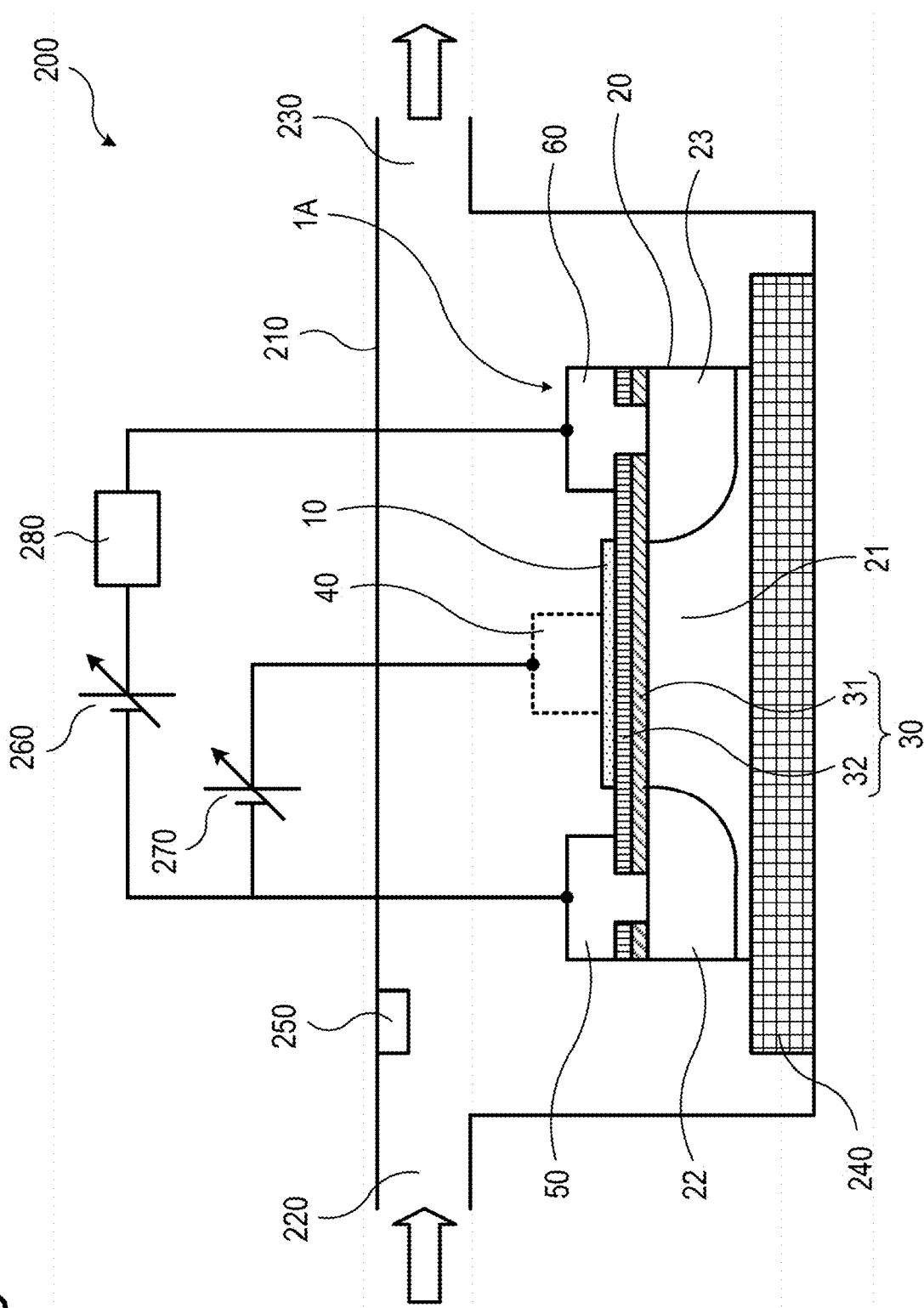

ELECTRONIC DEVICE, MANUFACTURING METHOD FOR ELECTRONIC DEVICE, AND ELECTRONIC APPARATUS

CROSS-REFERENCE TO RELATED APPLICATION

This application is based upon and claims the benefit of priority of the prior Japanese Patent Application No. 2017-229880, filed on Nov. 30, 2017, the entire contents of which are incorporated herein by reference.

FIELD

The embodiments discussed herein are related to an electronic device, a manufacturing method for an electronic device, and an electronic apparatus.

BACKGROUND

A technology is known that stacks a graphene with an organic molecular film and dopes the graphene with electrons or holes by the organic molecular film to reduce the sheet resistance of the graphene. In addition, a technology is known that uses a graphene in a transistor. For example, a gas sensor has been proposed which uses a graphene as a gate of a field effect transistor (FET) and detects a target gas based on a change in the drain current caused by a change in the threshold voltage due to a change in the work function when the target gas such as, for example, ammonia is adsorbed onto the graphene.

Related techniques are disclosed in, for example, International Publication Pamphlet Nos. WO 2014/030534 and WO 2017/002854.

SUMMARY

According to an aspect of the embodiments, an electronic device includes, a semiconductor layer, a source region and a drain region provided with the semiconductor layer to be interposed therebetween, a gate insulation film on the semiconductor layer between the source region and the drain region, and a gate of a graphene on the gate insulation film. The gate insulation film induces doping of charges in the graphene.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 9 is a view illustrating an exemplary gas sensor system using the electronic device according to the second embodiment;

FIGS. 10A to 10C are views illustrating an exemplary electronic device according to a third embodiment, in which FIG. 10A is a view schematically illustrating the cross section of a major portion of the electronic device, FIG. 10B is a view schematically illustrating the cross section of a major portion of a gate insulation film in the electronic device, and FIG. 10C is a view schematically illustrating the cross section of a major portion of a graphene in the electronic device;

DESCRIPTION OF EMBODIMENTS

In an electronic device that uses a graphene as a gate of an FET, it is important to adjust the work function of the graphene. For example, in the gas sensor as described above, when a component other than a detection target component, for example, another gas component in the atmosphere is adsorbed onto the graphene, which affects a change in the work function of the graphene at the time of adsorption of the target component, it is difficult to properly detect the target component. In addition, when the FET using the graphene as a gate is used as a switching element, the threshold voltage and switching characteristics of the FET are determined by the work function of the graphene which is used as the gate.

In this way, in the electronic device that uses the graphene as the gate of the FET, adjusting the work function of the graphene is an important factor in realizing high device performance.

First, a first embodiment will be described.

Figure 1:
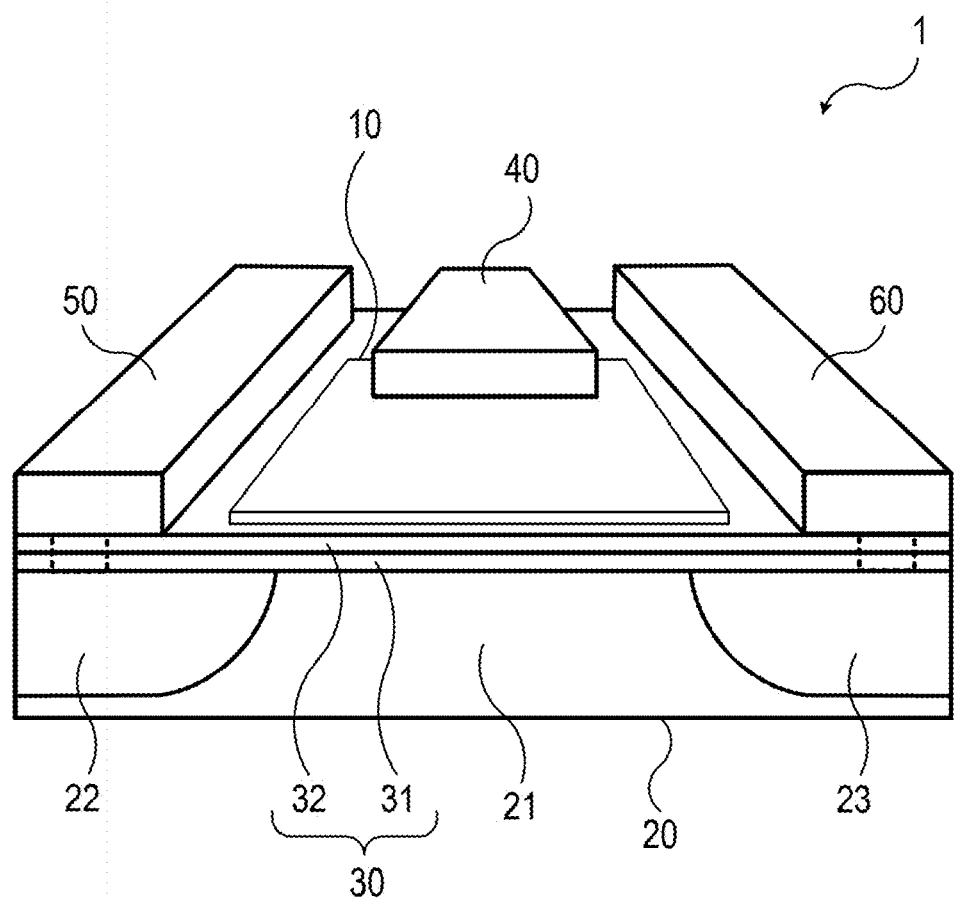
FIG. 1 is a view illustrating an exemplary electronic device according to a first embodiment.

FIG. 1 is a view illustrating an exemplary electronic device according to a first embodiment. FIG. 1 schematically illustrates a perspective view of a major portion of the electronic device.

The electronic device 1 illustrated in FIG. 1 includes an FET in which a graphene 10 is used as a gate. The electronic device 1 includes a semiconductor substrate 20, a gate insulation film 30, the graphene 10, a gate electrode 40, a source electrode 50, and a drain electrode 60.

For the semiconductor substrate 20, for example, a silicon (Si) substrate is used. In addition to the silicon substrate, various semiconductor substrates such as, for example, germanium (Ge), silicon germanium (SiGe), silicon carbide (SiC), gallium nitride (GaN), indium phosphide (InP), and gallium arsenide (GaAs), may be used for the semiconductor substrate 20.

In the semiconductor substrate 20, a source region 22 and a drain region 23 are provided so as to face each other across a portion of a semiconductor region 21. The source region 22 and the drain region 23 are formed by ion-implanting a predetermined conductive type dopant into the semiconductor substrate 20. The semiconductor region 21 is of a conductive type opposite to that of the source region 22 and the drain region 23. For example, the semiconductor region 21 is a p-type and the source region 22 and the drain region 23 are an n-type ($n^{++}$). The semiconductor region 21 is formed using a p-type semiconductor substrate 20 or by ion-implanting a p-type dopant into an un-doped semiconductor substrate 20. The semiconductor region 21 interposed between the source region 22 and the drain region 23 functions as a channel region of the FET.

The gate insulation film 30 is provided on the semiconductor substrate 20 which includes the semiconductor region 21, the source region 22, and the drain region 23. The graphene 10 is provided on the semiconductor region 21, which is interposed between the source region 22 and the drain region 23 of the semiconductor substrate 20, via the gate insulation film 30.

The gate insulation film 30 has a laminated structure including an insulation film 31 provided on the semiconductor substrate 20 and an insulation film 32 provided on the insulation film 31. The graphene 10 is provided on the insulation film 32 at the upper layer side of the gate insulation film 30 so as to be in contact with the insulation film 32.

Various insulation materials such as, for example, silicon oxide ($SiO_2$), hafnium oxide ($HfO_2$), and aluminum oxide ($Al_2O_3$) are used for the insulation film 31 at the lower layer side (the semiconductor substrate 20 side) of the gate insulation film 30. The insulation film 31 is formed using, for example, a thermal oxidation method or a deposition method (e.g., an atomic layer deposition (ALD) method, a physical vapor deposition (PVD) method, a chemical vapor deposition (CVD) method, or a sputtering method). The insulation film 31 is, for example, a single layer insulation film. In addition, the insulation film 31 may have a laminated structure of two or more layers of insulation films in which the same or different insulation materials are used.

For the insulation film 32 at the upper layer side (the graphene 10 side) of the gate insulation film 30, a material that induces the doping of charges (electrons or holes) in the graphene 10 provided in contact with the insulation film 32 is used. For the insulation film 32, an organic material may be used or an inorganic material may be used. The insulation film 32 is formed by a method depending on the material to be used therein.

As one form, the insulation film 32 dopes the graphene 10 with charges by introducing the charges into the graphene 10. For example, the insulation film 32 dopes the graphene 10 with electrons by donating the electrons to the graphene 10. Alternatively, the insulation film 32 dopes the graphene 10 with holes by attracting electrons from the graphene 10. As a material of the insulation film 32 that donates electrons to the graphene 10, a material having a functional group or atom which acts to donate electrons to the graphene 10 in a constituent molecule thereof is used. In addition, as a material of the insulation film 32 that attracts electrons from the graphene 10, a material having a functional group or atom which acts to attract electrons from the graphene 10 in a constituent molecule thereof is used.

In addition, as another form, the insulation film 32 dopes the graphene 10 with charges by generating the charges in the graphene 10. For example, the insulation film 32 dopes the graphene 10 with electrons or holes by inducing the electrons or holes in the graphene 10 by the polarity thereof. The polarity of the insulation film 32 may be realized by the polarity (polar group) possessed by a specific functional group or atom in a constituent molecule of the insulation film 32, or may be realized by the polarity (polar molecule) possessed by the entire constituent molecule of the insulation film 32. The polarity of the insulation film 32 may be revealed by the polarity of the entire insulation film 32.

The graphene 10 is provided above the insulation film 32 which induces the doping of charges in the graphene 10 as described above so as to be in contact with the insulation film 32. The graphene 10 is provided, for example, by transferring a graphene which is separately formed on a predetermined substrate onto the insulation film 32.

The gate electrode 40 is connected to the graphene 10 on the insulation film 32. The gate electrode 40 is provided at a position at which it does not overlap the channel region (the whole or a part of the semiconductor region 21) between the source region 22 and the drain region 23 in a plan view, and is connected to the graphene 10.

The source electrode 50 and the drain electrode 60 are connected respectively to the source region 22 and the drain region 23. For example, the source electrode 50 and the drain electrode 60 are provided on the gate insulation film 30 having openings that reach the source region 22 and the drain region 23, respectively, and are connected to the source region 22 and the drain region 23 through the openings in the gate insulation film 30, respectively.

The electronic device 1 having the above-described configuration is used as, for example, a gas sensor. The gas sensor detects a chemical substance contained in the atmosphere, adopts various measurement principles, and is widely used, for example, for environmental measurement. For example, nitrogen dioxide ($NO_2$) contained in the exhaust gas of an automobile has an environmental reference value ranging from about 20 ppb (parts per billion) to about 40 ppb, and detection of an extremely low concentration thereof is required. In addition, in recent years, a relationship between a chemical substance contained in an exhalation and a health state has been pointed out, and for example, a relationship between a gastric cancer and the concentration of ammonia ($NH_3$) in an exhalation and a relationship between asthma and the concentration of nitric oxide (NO) have been pointed out. The threshold of diagnosis thereof ranges from several tens of ppb to several hundreds of ppb, and in this case, detection of an extremely low concentration thereof is also required.

When the electronic device 1 described above is used as a gas sensor, a current monitoring device (not illustrated) is connected between the source electrode 50 and the drain electrode 60 to detect current flowing therebetween. A predetermined bias is applied between the source electrode 50 and the drain electrode 60 and between the source electrode 50 and the gate electrode 40 by a bias power supply (not illustrated).

When a component to be detected (detection target component) in a certain atmosphere is adsorbed onto the graphene 10 of the electronic device 1 which is used as a gas sensor placed in the atmosphere, the graphene 10 is doped with charges by the adsorbed detection target component, and the work function of the graphene 10 changes. When the work function of the graphene 10 changes, a flat band voltage changes, and the threshold voltage of the FET in which the graphene 10 is used as a gate changes. As a result, when the bias of the gate electrode 40 is constant, drain current flowing between the source electrode 50 (source region 22) and the drain electrode 60 (drain region 23) changes. By detecting the drain current using the current monitoring device connected between the source electrode 50 and the drain electrode 60, the presence or absence of the detection target component in the atmosphere or the amount (the number of molecules or the concentration) of the detection target component in the atmosphere may be detected.

For example, in the electronic device 1 used as a gas sensor that detects nitrogen oxide or ammonia in the atmosphere, when nitrogen oxide or ammonia is adsorbed onto the graphene 10, the graphene 10 is doped with electrons by the adsorption. Therefore, the work function of the graphene 10 changes, and the threshold voltage of the FET in which the graphene 10 is used as a gate changes. By detecting the drain current of the FET under a predetermined bias condition, nitrogen oxide or ammonia in the atmosphere is detected.

In addition, although a stationary type device such as, for example, a gas chromatograph is effective for the detection of a low concentration gas, the device is relatively large. Meanwhile, there is a high need for a device that is compact and simple and is capable of performing detection in real time, and for example, a portable semiconductor type sensor has also been developed. There is a sensor that uses, for example, a change in the resistance when a gas is adsorbed onto an oxide semiconductor. One example thereof is an ethanol sensor using stannic oxide, but the detection limit of such a sensor is about 1 ppm (part per million) and the sensitivity thereof is generally not high. According to the electronic device 1 described above, it is possible to realize a small high sensitivity gas sensor.

By the way, a component other than the detection target component (component other than a detection target) may generally be contained in the atmosphere in which the gas sensor is placed. For example, when detecting nitrogen oxide or ammonia in the air or in an exhalation, for example, oxygen ($O_2$) in the air is a component other than a detection target. When such a component other than a detection target is adsorbed onto the gate of a gas sensor that detects a detection target component by adsorbing the detection target component to the gate, this may affect the work function of the gate and may affect detection sensitivity.

Figure 2A:
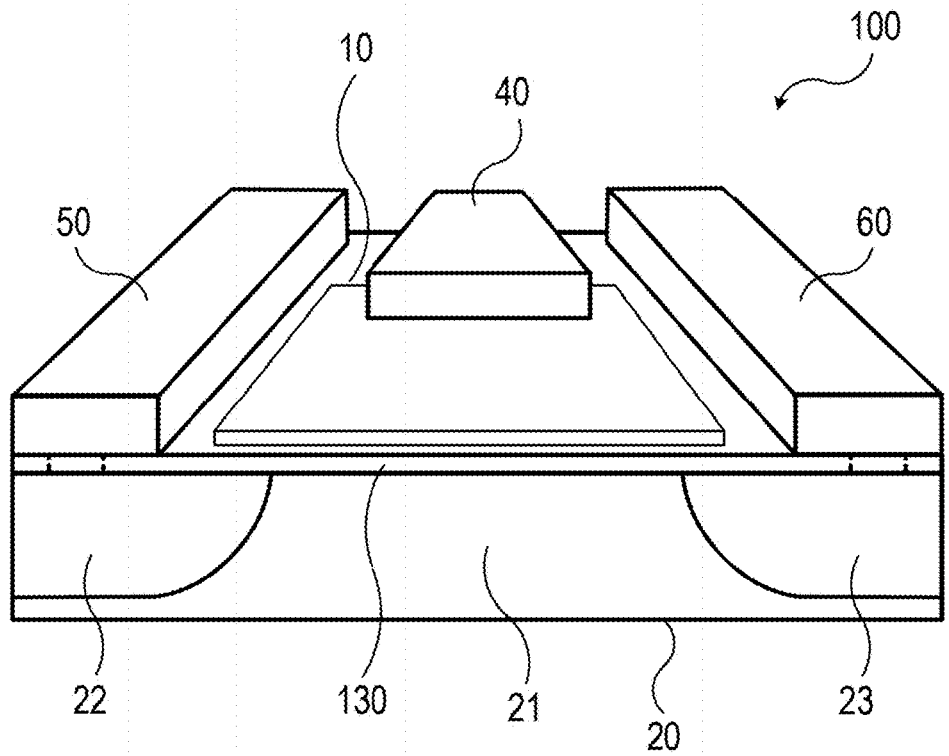
FIG. 2A is a view illustrating another exemplary electronic device, and FIG. 2B schematically illustrates the energy state of a graphene used in the electronic device.

Here, for comparison with the electronic device 1, another exemplary electronic device that may be used as a gas sensor is illustrated in FIG. 2A. FIG. 2A schematically illustrates a perspective view of a major portion of the electronic device, and FIG. 2B schematically illustrates the energy state of a graphene used in the electronic device.

The electronic device 100 illustrated in FIG. 2A differs from the electronic device 1 in that the graphene 10 is provided on the semiconductor substrate 20 with a gate insulation film 130 which does not have a function of inducing the doping of charges in the graphene 10 interposed therebetween.

In the detection of nitrogen oxide or ammonia in the atmosphere of an inert gas such as nitrogen ($N_2$), the electronic device 100 may realize detection with very high sensitivity such as a sub ppb for nitrogen oxide and tens of ppb for ammonia. However, in the detection of a detection target component such as nitrogen oxide or ammonia in the air, oxygen in the air is also adsorbed onto the graphene 10. When oxygen in the air is adsorbed onto the graphene 10, the graphene 10 is doped with holes.

Figure 2B:
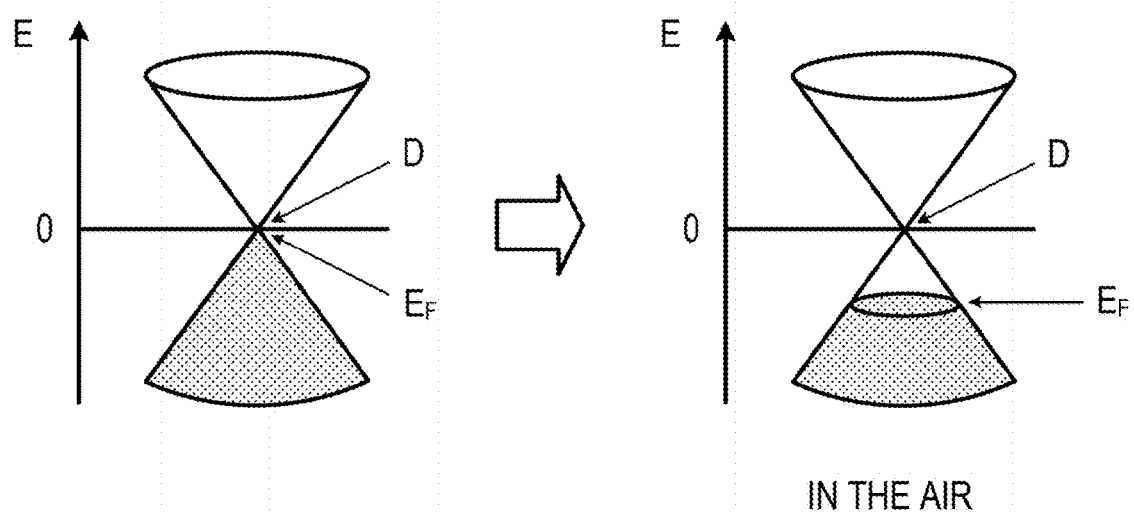

As illustrated in the left view of FIG. 2B, the graphene 10 originally represents a band structure (Dirac cone) in which a valence band and a conduction band are in point contact with each other at a Dirac point D, and the Fermi level $E_F$ is located at the Dirac point D. When oxygen in the air is adsorbed onto the graphene 10 and the graphene 10 is doped with holes, the position of the Fermi level $E_F$ drops from the Dirac point D, as illustrated in the right view of FIG. 2B. As a result, in the graphene 10 to which oxygen in the air has been adsorbed, even when the detection target component such as nitrogen oxide or ammonia is adsorbed thereto, a change in the work function is less than that when a detection target component is adsorbed in the atmosphere of an inert gas such as nitrogen. That is, the detection sensitivity of the detection target component decreases.

In this way, when the electronic device 100 illustrated in FIG. 2A is used as a gas sensor in the air, the detection sensitivity of the detection target component may decrease due to oxygen in the air.

In contrast, in the electronic device 1 illustrated in FIG. 1, the gate insulation film 30 has a laminated structure of the insulation film 31 and the insulation film 32, and the graphene 10 is provided on the insulation film 32 that induces the doping of charges in the graphene 10. For example, when the electronic device 1 is placed in the air containing oxygen to perform detection of a detection target component, an insulation film 32 which induces the doping of electrons in the graphene 10 (that causes the graphene 10 to be doped with electrons) is provided as the insulation film 32 under the graphene 10.

Figure 3A:
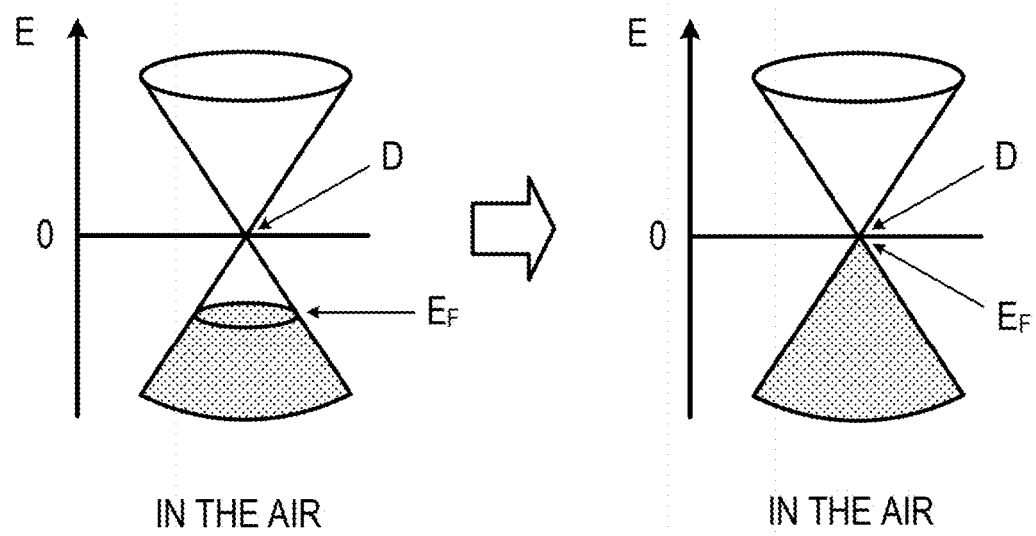
FIG. 3A is a view schematically illustrating a change in the energy state of a graphene used in the electronic device according to the first embodiment.
Figure 3B:
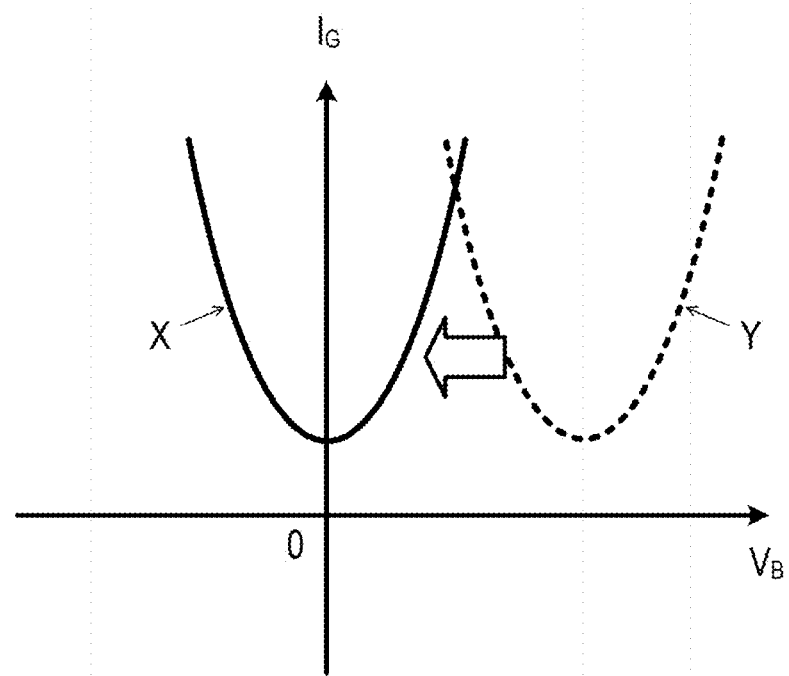
FIG. 3B is a view schematically illustrating the current-voltage characteristics of the electronic device.

FIG. 3A is an explanatory view of the electronic device according to the first embodiment. FIG. 3A schematically illustrates the energy state of the graphene used in the electronic device. FIG. 3B schematically illustrates the current-voltage characteristics of the electronic device.

For example, as described above, when the electronic device 1 illustrated in FIG. 1 is used as a gas sensor and is placed in the air to perform detection of a detection target component such as nitrogen oxide or ammonia, the insulation film 32 which causes the graphene 10 to be doped with electrons is provided under the graphene 10. Therefore, the graphene 10 is doped with holes by the influence of adsorption of oxygen in the air, more specifically, by the adsorption of oxygen, and as illustrated in the left view of FIG. 3A, drop of the Fermi level $E_F$ from the Dirac Point D is suppressed.

That is, even if holes are doped into the graphene 10 by the adsorption of oxygen in the air, the graphene 10 is doped with electrons by the insulation film 32 which induces the doping of the electrons. As a result, the Fermi level $E_F$ which has dropped from the Dirac point D by the adsorption of oxygen in the air as illustrated in the left view of FIG. 3A again returns to or near the Dirac point D as illustrated in the right view of FIG. 3A. Alternatively, the Fermi level $E_F$ which tries to drop from the Dirac point D by the adsorption of oxygen in the air is maintained at or near the Dirac point D as illustrated in the right view of FIG. 3A. Alternatively, the Fermi level $E_F$ is positioned above the Dirac point D before the adsorption of oxygen in the air, and when oxygen in the air is adsorbed, the Fermi level $E_F$ is maintained at or near the Dirac point D.

In this way, in the electronic device 1 placed in the air, the insulation film 32 which induces the doping of electrons in the graphene 10 is provided under the graphene 10. That is, the graphene 10 which is doped with holes by the adsorption of oxygen in the air is provided with the insulation film 32 which causes the graphene 10 to be doped (counter-doped) with electrons which are charges opposite to holes. By providing such an insulation film 32 under the graphene 10, it is possible to adjust the Fermi level $E_F$ of the graphene 10 to or near the Dirac point D even at the time of detection in the air. Therefore, it is possible to suppress the influence of adsorption of oxygen in the air to the graphene 10 and to detect a detection target component which is contained in the air together with oxygen with high sensitivity.

FIG. 3B schematically illustrates an example of the current-voltage characteristics of the graphene 10 when electrodes are disposed at both ends of the graphene 10 of the electronic device 1 (FIG. 1) or the electronic device 100 (FIG. 2A) which is placed in the air (although not illustrated in FIGS. 1 and 2A, in this case, the electrodes are disposed on the front side of the paper so as to face the electrode 40). Here, for each of the electronic device 1 and the electronic device 100, a relationship between the back gate voltage $V_B$ and the current $I_G$ flowing in the graphene 10 when a voltage is applied to both ends of the graphene 10 and the back gate voltage is again applied to the semiconductor substrate 20 is illustrated. In FIG. 3B, the relationship between the back gate voltage $V_B$ and the current $I_G$ for the electronic device 1 is indicated by the solid line X and the relationship between the back gate voltage $V_B$ and the current $I_G$ for the electronic device 100 is indicated by the dotted line Y.

In FIG. 3B, in the electronic device 1 (solid line X) placed in the air, the back gate voltage $V_B$ at which the current $I_G$ flowing in the graphene 10 is minimized is zero or near zero. Meanwhile, in the electronic device 100 (dotted line Y) placed in the air, the back gate voltage $V_B$ at which the current $I_G$ flowing in the graphene 10 is minimized shifts to a further positive voltage side. From this, it can be said that the graphene 10 of the electronic device 100 placed in the air is doped with holes.

In the electronic device 1, the insulation film 32 which induces the doping of electrons is provided under the graphene 10, and the graphene 10 which is doped with holes by the adsorption of oxygen in the air is doped with electrons by the insulation film 32, and is not substantially doped with charges or becomes a state close thereto. Therefore, in the electronic device 1, as indicated by the solid line X in FIG. 3B, the current $I_G$ flowing in the graphene 10 is minimized when the back gate voltage $V_B$ is zero or near zero.

Meanwhile, in the electronic device 100, the insulation film 32 described above is not provided under the graphene 10, and the graphene 10 is in a state of being doped with holes by the adsorption of oxygen in the air. Therefore, in the electronic device 100, as indicated by the dotted line Y in FIG. 3B, the back gate voltage $V_B$ at which the current $I_G$ flowing in the graphene 10 is minimized shifts to a further positive voltage side.

In other words, it can be said that the electronic device 1 has the effect of shifting the current-voltage characteristic as seen in the electronic device 100 to a state where the current $I_G$ flowing in the graphene 10 is minimized when the back gate voltage $V_B$ is zero or near zero (a state where the graphene is not substantially doped with charges or becomes a state close thereto) by the insulation film 32 under the graphene 10.

In addition, in the above description, a case of performing detection of a specific component contained in the air is taken as an example, but the atmosphere in which detection is performed is not limited to the air. Rather than being limited to the atmosphere such as the air containing oxygen, in the atmosphere containing a component other than a detection target which causes the graphene 10 of the electronic device 1 to be doped with holes by adsorption like oxygen, the same method as described above may be adopted when detecting a detection target component in the atmosphere. That is, the insulation film 32 which induces the doping of electrons may be provided under the graphene 10 and may cause the graphene 10 which is doped with holes by the adsorption of a component other than a detection target in the atmosphere to be doped with electrons which are charges opposite to holes.

In addition, in the atmosphere containing a component other than a detection target which causes the graphene 10 of the electronic device 1 to be doped with electrons by adsorption, the same method as described above may also be adopted even when detecting a detection target component in the atmosphere. That is, the insulation film 32 which induces the doping of holes is provided under the graphene 10 and causes the graphene 10 which is doped with electrons by the adsorption of a component other than a detection target in the atmosphere to be doped with holes which are charges opposite to electrons. This makes it possible to suppress the deviation of the Fermi level $E_F$ from the Dirac point D due to the adsorption of a component other than a detection target in the atmosphere and to detect a detection target component in the atmosphere with high sensitivity.

In addition, in the electronic device 1, a protective film may be provided on the graphene 10 to protect the graphene 10. However, when the electronic device 1 is used as a gas sensor, an opening that reaches the graphene 10 is provided in a portion of the protective film provided on the graphene 10 in order to enable the adsorption of a detection target component to the graphene 10.

In addition, the electronic device 1 having the above-described configuration may be used as a switching element that controls an on/off operation in an electronic circuit, in addition to a gas sensor that detects a specific component in the atmosphere. The work function of the graphene 10 may be adjusted by selecting the function of the insulation film 32 under the graphene 10, i.e., the function of inducing the doping of electrons or the function of inducing the doping of holes. This makes it possible to adjust the threshold voltage of a gate (graphene 10). When the electronic device 1 is used as such a switching element, the protective film that covers the graphene 10 may be provided in order to suppress the adsorption of a component contained in the atmosphere to the graphene 10.

In addition, in the above description, an example in which the insulation film 32 which induces the doping of charges in the graphene 10 is provided on the insulation film 31 such as, for example, silicon oxide has been illustrated, but the insulation film 31 as a base may be omitted as long as the occurrence of an unformed portion of the insulation film 32 is suppressed and the insulation film 32 may be formed with good film forming properties.

Next, a second embodiment will be described.

Figure 4A:
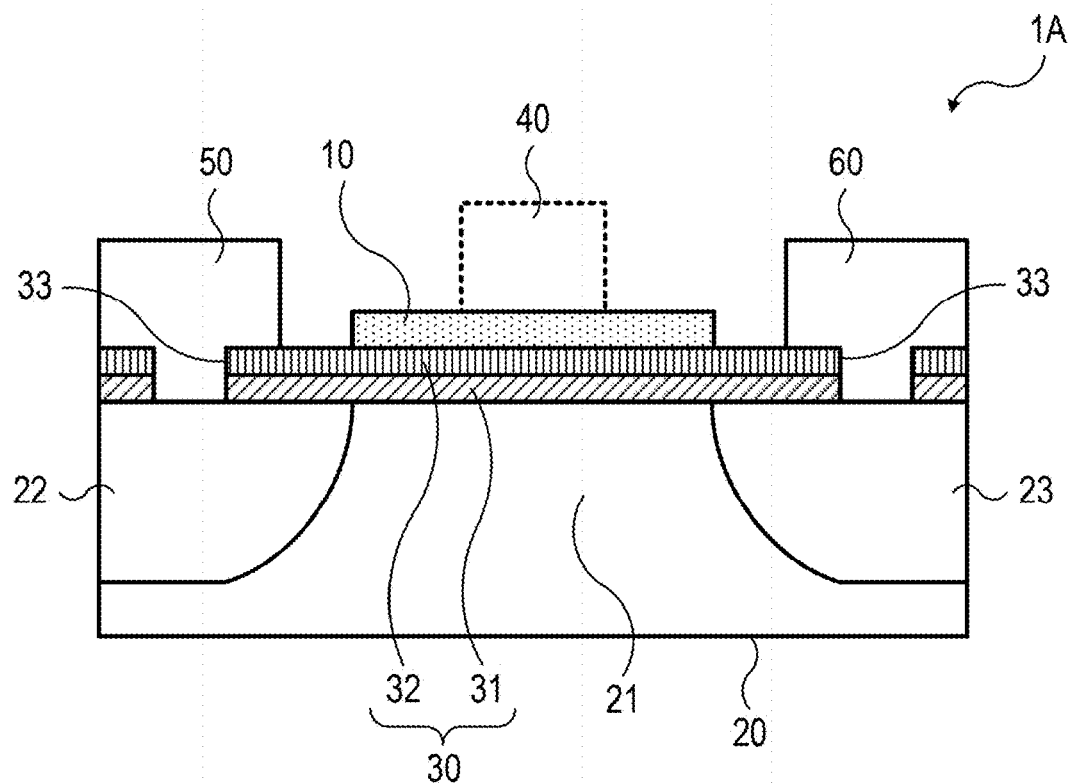
FIG. 4A is a view illustrating an exemplary electronic device according to a second embodiment.
Figure 4B:
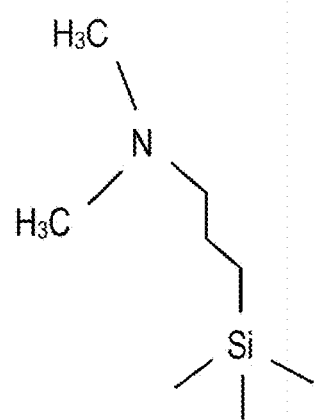
FIG. 4B is a view illustrating an exemplary molecule constituting a gate insulation film.

FIG. 4A is a view illustrating an exemplary electronic device according to a second embodiment. FIG. 4A schematically illustrates the cross section of a major portion of the electronic device. FIG. 4B illustrates an exemplary molecule constituting a gate insulation film.

The electronic device 1A illustrated in FIG. 4A includes the semiconductor substrate 20, the gate insulation film 30, the graphene 10, the gate electrode 40, the source electrode 50, and the drain electrode 60. For the semiconductor substrate 20, for example, a silicon substrate is used. In the semiconductor substrate 20, the source region 22 and the drain region 23 are provided so as to face each other across a portion of the semiconductor region 21. For example, the semiconductor region 21 is a p-type, and the source region 22 and the drain region 23 are an n-type. The semiconductor region 21 interposed between the source region 22 and the drain region 23 functions as a channel region of the FET.

The graphene 10 is provided on the semiconductor region 21 which is interposed between the source region 22 and the drain region 23 of the semiconductor substrate 20 with the gate insulation film 30 interposed therebetween. The gate insulation film 30 includes the insulation film 31 provided on the semiconductor substrate 20 and the insulation film 32 provided on the insulation film 31. The graphene 10 is provided on the insulation film 32 at the upper layer side of the gate insulation film 30 so as to be in contact with the insulation film 32.

For example, silicon oxide is used for the insulation film 31 at the lower layer side (the graphene 10 side) of the gate insulation film 30. Hafnium oxide or aluminum oxide may be used for the insulation film 31. For the insulation film 32 at the upper layer side (the graphene 10 side) of the gate insulation film 30, a material which induces the doping of electrons in the graphene 10 provided in contact with the insulation film 32 is used. Here, a self-assembled monolayer (SAM) film is used as the insulation film 32. An exemplary SAM film is illustrated in FIG. 4B.

The SAM film illustrated in FIG. 4B has a molecular structure in which an alkyl chain is a basic framework and a bonding group bonded to the insulation film 31 as a base is provided at a terminal on one side thereof and a dimethylamino group ($-N(CH_3)_2$) having polarity is provided at a terminal on the other side thereof. The SAM film is in contact with the graphene 10 at the dimethylamino group terminal side. The graphene 10 is doped with electrons as the electrons are donated from the dimethylamino group having polarity to the graphene 10 by interaction between the dimethylamino group of the SAM film and the graphene 10. Alternatively, the graphene 10 is doped with electrons as the electrons are induced in the graphene 10 by the polarity of the dimethylamino group of the SAM film.

In addition, the molecular structure of the SAM film illustrated in FIG. 4B is taken as an example, and the SAM film used as the insulation film 32 may adopt various molecular structures. For example, the length of the alkyl chain (the number of carbons of the basic framework) is not limited to the above example. In addition, a terminal functional group on the graphene 10 side is not limited to the dimethylamino group as long as it induces the doping of charges (electrons in this example) in the graphene 10. For example, an amino group, an alkylamino group, a dialkylamino group, or a trialkylamino group may be used to induce the doping of electrons in the graphene 10. In addition, various bonding groups are adopted as the bonding group on the side of the insulation film 31 as a base as long as they are bonded to the surface of the insulation film 31.

The graphene 10 on the insulation film 32 is connected to the gate electrode 40 provided at a position at which it does not overlap the channel region between the source region 22 and the drain region 23. In addition, the gate electrode 40 provided at such a position is indicated by a dotted line in the cross-sectional view of FIG. 4A for the sake of convenience. In addition, the source electrode 50 and the drain electrode 60 are connected to the source region 22 and the drain region 23 through openings 33 provided in the gate insulation film 30, respectively.

In addition, in FIG. 4A, the source electrode 50 and the drain electrode 60 are provided directly above the source region 22 and the drain region 23, but the source electrode 50 and the drain electrode 60 may be disposed at positions away from the source region 22 and the drain region 23, respectively as long as they are electrically connected thereto (e.g., via highly doped silicon). When the source electrode 50 and the drain electrode 60 are provided respectively at positions away from the source region 22 and the drain region 23, diffusion of components of the source electrode 50 and the drain electrode 60 to the channel region is effectively suppressed.

Next, a method of forming the electronic device 1A having the above-described configuration will be described.

FIGS. 5A to 5C and FIGS. 6A to 6C are views illustrating an exemplary method of forming the electronic device according to the second embodiment. FIGS. 5A to 5C and FIGS. 6A to 6C schematically illustrate the cross section of a major portion in each step of forming the electronic device.

Figure 5A:
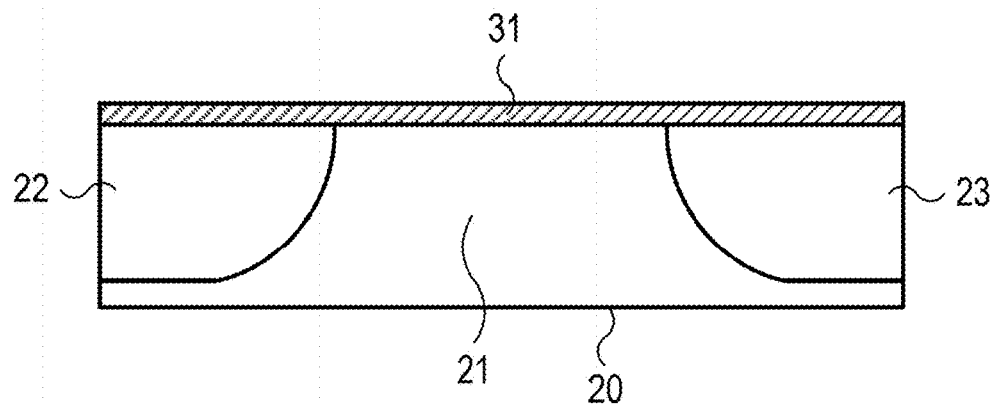
FIGS. 5A to 5C are views illustrating an exemplary method of forming the electronic device according to the second embodiment.

First, as illustrated in FIG. 5A, the insulation film 31 at the lower layer side of the gate insulation film 30 is formed on the semiconductor substrate 20 in which the source region 22 and the drain region 23 are formed. The semiconductor substrate 20 is formed with the p-type semiconductor region 21 using a p-type semiconductor substrate or by ion-implanting a p-type dopant into an undoped semiconductor substrate. The source region 22 and the drain region 23, which face each other across the semiconductor region 21, are formed by ion-implanting an n-type dopant into the semiconductor substrate 20. The insulation film 31 is formed by thermally oxidizing the surface of the semiconductor substrate 20. In addition, hafnium oxide or aluminum oxide may be deposited on the semiconductor substrate 20 by an ALD method to form the insulation film 31.

Figure 5B:
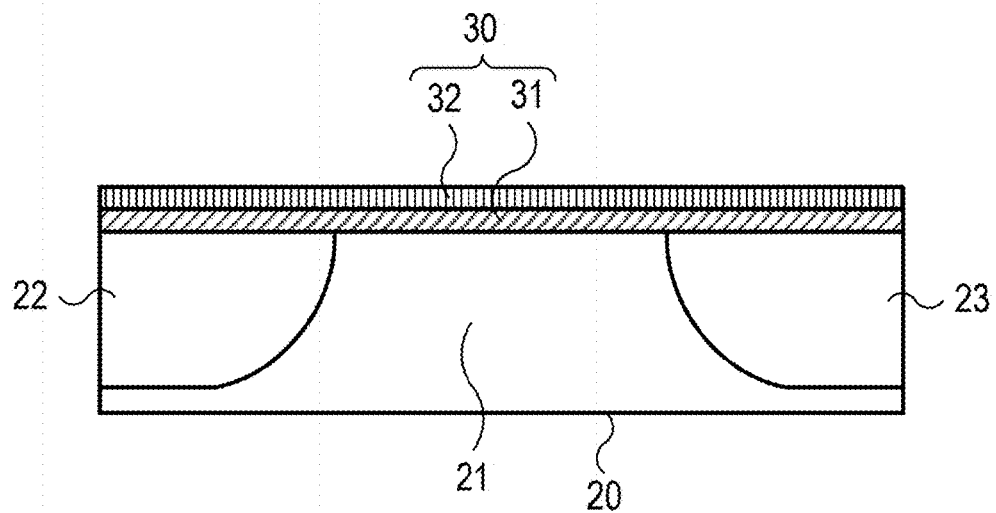

Subsequently, as illustrated in FIG. 5B, an SAM film is formed as the insulation film 32 at the upper layer side of the gate insulation film 30. The SAM film is formed by, for example, a vapor method. More specifically, first, the semiconductor substrate 20 on which the insulation film 31 at the lower layer side has been formed as described above and a raw material of the SAM film placed in an open container are placed in a sealed container under the inert atmosphere at the atmospheric pressure. As the raw material of the SAM film, for example, [3-(N,N-dimethylamino) propyl] trimethoxysilane is used. In addition, for example, 3-aminopropyltriethoxysilane or trimethoxy [3-(methylamino) propyl] silane may be used as the raw material of the SAM film. Subsequently, the sealed container, which accommodates the semiconductor substrate 20 on which the insulation film 31 has been formed and the raw material of the SAM film, is placed in an electric furnace, and a heat treatment is performed for about several hours. The heating temperature is, for example, 100° C. By this heat treatment, the raw material of the SAM film is silane-bonded to the surface of the insulation film 31. Therefore, the SAM film is formed on the insulation film 31. Various treatments are performed on the formed SAM film. For example, an ethanol treatment, a toluene treatment, a potassium hydroxide treatment, and a nitric acid treatment are sequentially performed for about 10 minutes each. Thereafter, the SAM film is cleaned with pure water and is subjected to a nitrogen blowing treatment.

The formation of the SAM film is also described, for example, in the publication, "Surface And Interface Analysis" in 2002, volume No. 34, p. 550-554.

For example, by the method described above, as illustrated in FIG. 5B, the gate insulation film 30 including the insulation film 31 formed on the surface of the semiconductor substrate 20 and the SAM film formed as the insulation film 32 on the insulation film 31 is formed.

Figure 5C:
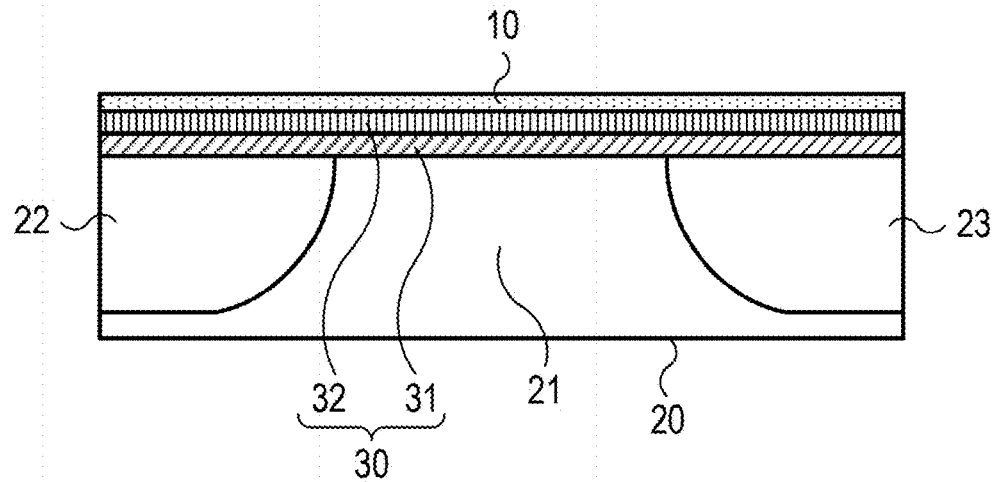

Subsequently, as illustrated in FIG. 5C, the graphene 10 is formed on the gate insulation film 30 (insulation film 32 thereof). The graphene 10 is formed on the gate insulation film 30 by, for example, a transfer method.

More specifically, first, a graphene is separately formed. For example, a base body including a thin copper (Cu) film having a thickness of about 1,000 nm formed on a silicon substrate provided with an oxide film is placed in a CVD apparatus, and a raw material gas is introduced into the CVD apparatus. As the raw material gas, for example, a mixed gas of methane ($CH_4$), hydrogen ($H_2$), and argon (Ar) is used. For example, the flow rate of methane is about 0.75 sccm (standard cubic centimeter per minute), the flow rate of hydrogen is about 100 sccm, and the flow rate of argon is about 1000 sccm. The raw material gas is introduced into the CVD apparatus for about 60 minutes under such a growth condition, and a graphene is formed on the base body. The graphene to be formed has a sufficiently large grain size and is formed in a single mono-crystal layer (mono atomic layer). In addition, a graphene having two or more layers may be formed by appropriately adjusting the growth condition (e.g., by setting a long growth time). Subsequently, the graphene formed on the base body is transferred onto the gate insulation film 30 on the semiconductor substrate 20 using a protective film such as, for example, a polymer.

In addition, the transfer of the graphene 10 is also described, for example, in the publication, "Nature in 2009, volume No. 457, p. 706-710."

For example, by the method as described above, as illustrated in FIG. 5C, a structure is obtained in which the graphene 10 is formed on the gate insulation film 30 so as to be in contact with the insulation film 32 at the upper layer side of the gate insulation film.

Figure 6A:
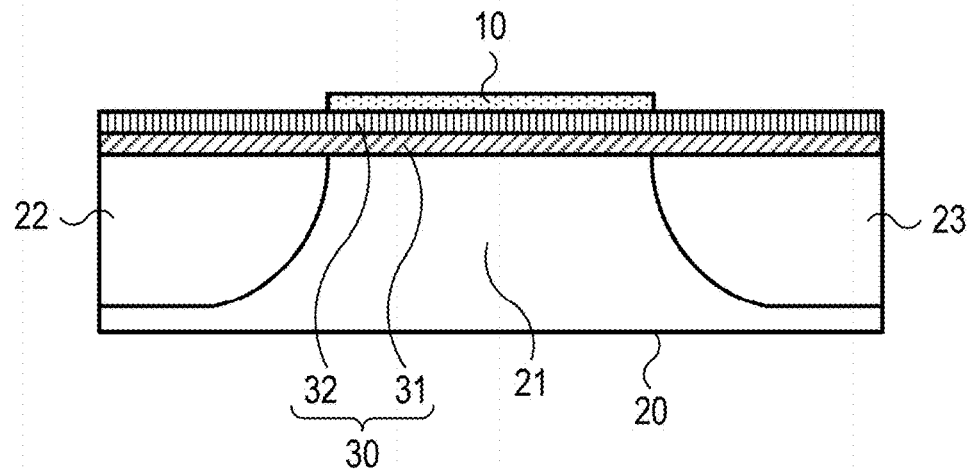
FIGS. 6A to 6C are views illustrating the exemplary method of forming the electronic device according to the second embodiment.

Subsequently, as illustrated in FIG. 6A, the graphene 10 formed on the gate insulation film 30 is patterned. The graphene 10 is patterned such that the graphene 10 is located above the semiconductor region 21 between the source region 22 and the drain region 23 of the semiconductor substrate 20. The patterning of the graphene 10 is performed using, for example, a photolithography technique and an etching technique. As an etching technique used for patterning the graphene 10, for example, reactive ion etching (RIE) using oxygen plasma may be cited.

Figure 6B:
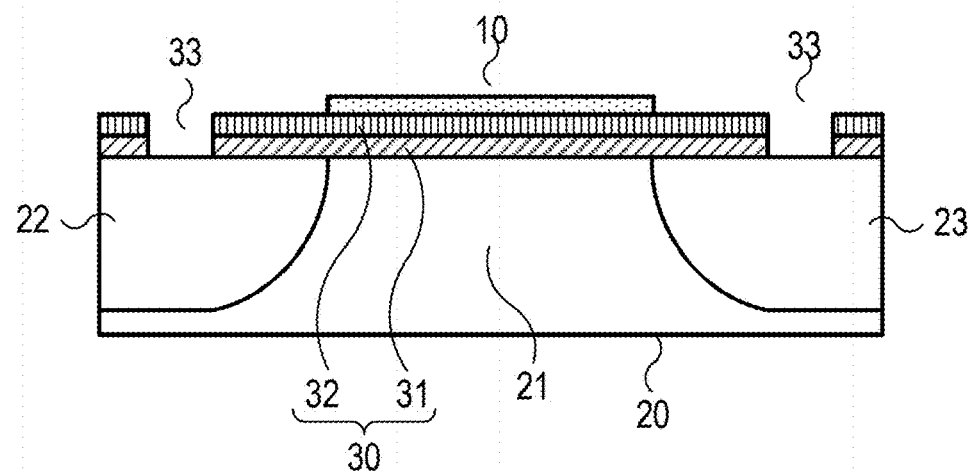

Subsequently, as illustrated in FIG. 6B, the gate insulation film 30 is patterned and the openings 33 that reach the source region 22 and the drain region 23 are formed. The patterning of the gate insulation film 30 forming the openings 33 is performed using, for example, a photolithography technique and an etching technique.

Figure 6C:
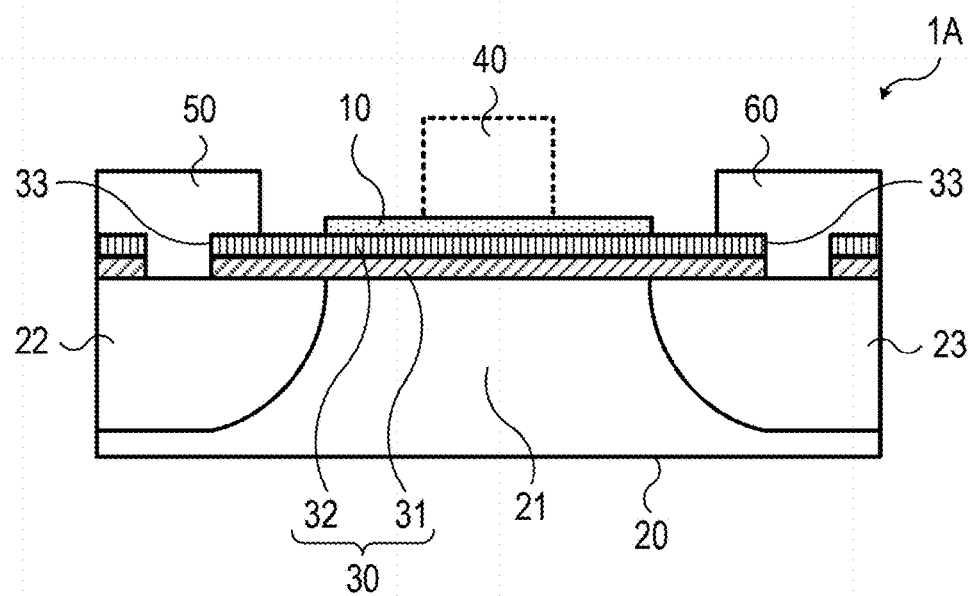

Subsequently, as illustrated in FIG. 6C, the gate electrode 40, the source electrode 50, and the drain electrode 60 are formed. The gate electrode 40 is provided so as to be connected to the graphene 10 at a position at which it does not overlap the channel region between the source region 22 and the drain region 23. The source electrode 50 and the drain electrode 60 are provided so as to be connected to the source region 22 and the drain region 23 through the openings 33 provided in the gate insulation film 30, respectively. In the formation of the gate electrode 40, the source electrode 50, and the drain electrode 60, a resist having openings in regions in which these electrodes are formed is first formed, and then a metal film is formed by a vacuum deposition method. Thereafter, the resist is removed together with the metal film formed thereon (lift-off method). In the formation of the metal film, for example, titanium (Ti) having a thickness of about 5 nm is formed as an adhesive material, and gold (Au) having a thickness of about 200 nm is formed thereon as an electrode material. According to this method, the gate electrode 40 connected to the graphene 10, the source electrode 50 connected to the source region 22, and the drain electrode 60 connected to the drain region 23 are formed in a predetermined region on the gate insulation film 30.

As described above, the electronic device 1A is formed by the method as illustrated in FIGS. 5A to 5C and FIGS. 6A to 6C.

The electronic device 1A is used as, for example, a gas sensor. When a detection target component in a certain atmosphere is adsorbed onto the graphene 10 of the electronic device 1A placed in the atmosphere, the graphene 10 is doped with charges by the adsorbed detection target component, and the work function of the graphene 10 changes. When the work function of the graphene 10 changes, the threshold voltage of the FET in which the graphene 10 is used as a gate changes. As a result, the drain current flowing between the source region 22 (source electrode 50) and the drain region 23 (drain electrode 60) changes under a predetermined bias. Based on such a change in the drain current, the detection target component (the presence or absence or the amount thereof) in the atmosphere is detected. In addition, a system configuration when the electronic device 1A is used as a gas sensor will be described later (FIG. 9).

Next, the characteristics of the electronic device 1A will be described.

Figure 7A:
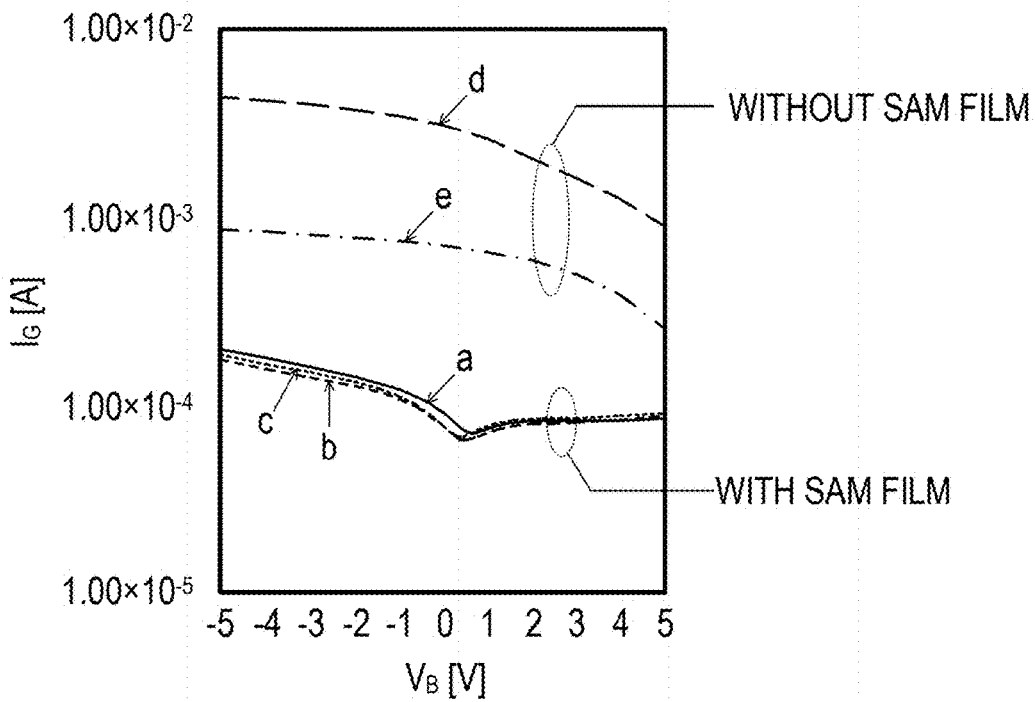
FIG. 7A is a view illustrating the current-voltage characteristics when each of electronic devices 1A (a, b and c) in which a graphene 10 is provided on an SAM film (insulation film 32) is placed in the air.
Figure 7B:
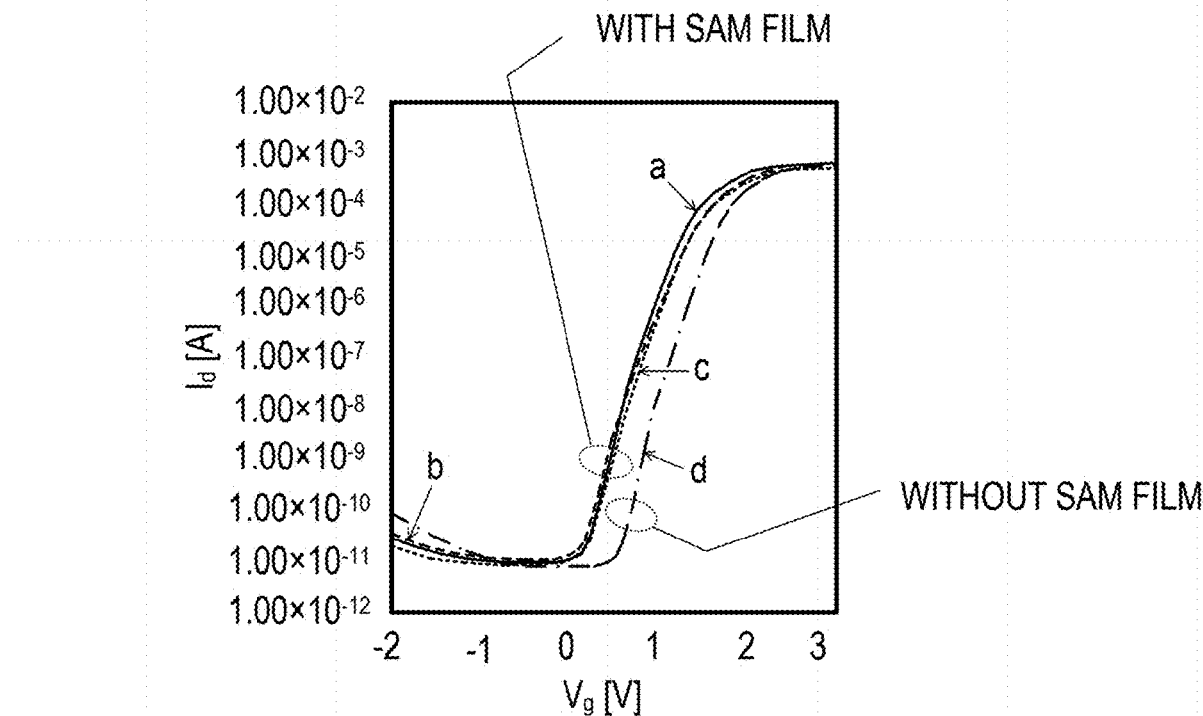
FIG. 7B is a view illustrating a relationship between the gate voltage $V_g$ [V] and the drain current $I_d$ [A] flowing between a source region 22 and a drain region 23 of the electronic devices 1A (a, b and c) in which the graphene 10 is provided on the SAM film.
Figure 8:
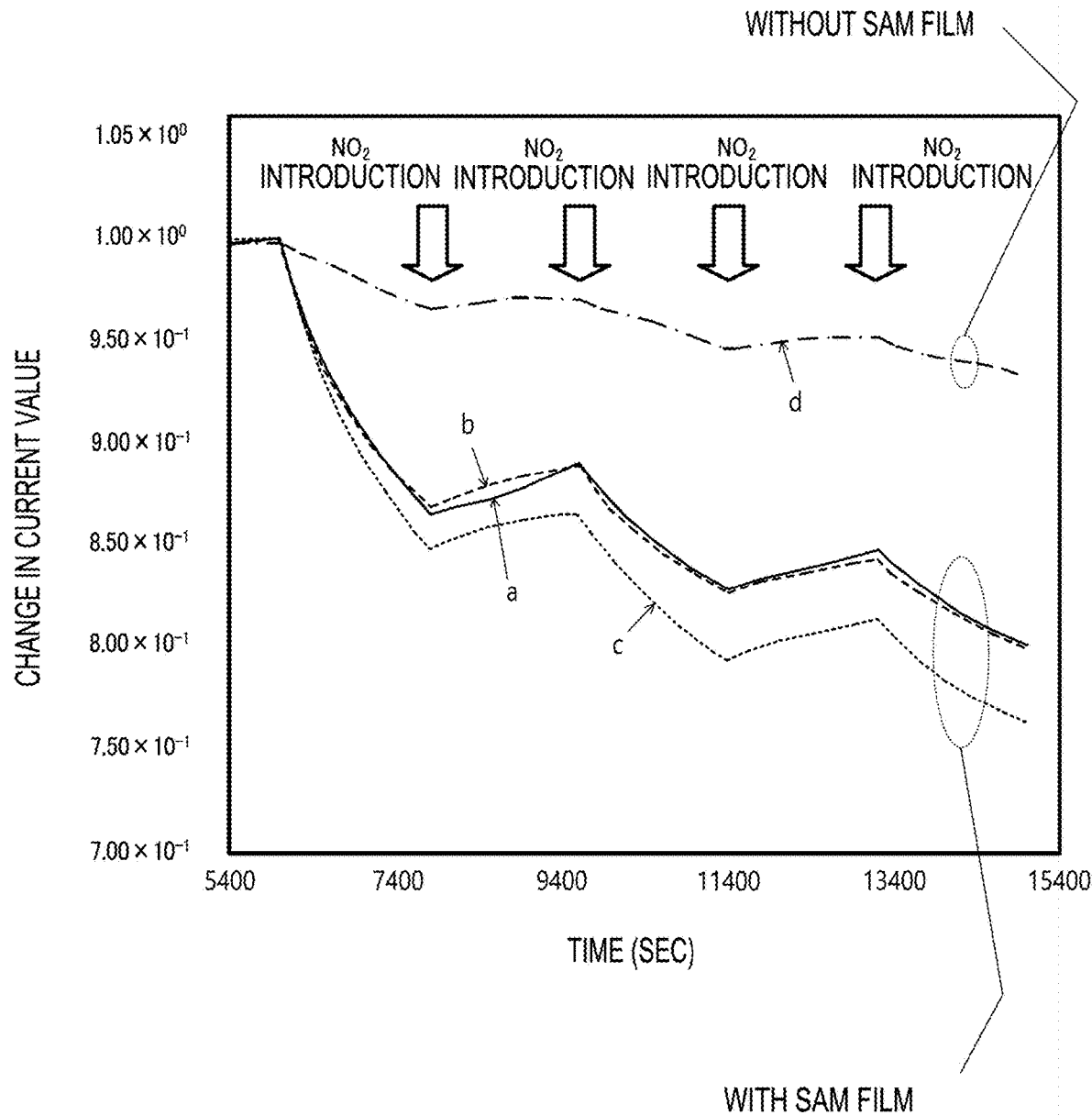
FIG. 8 is an explanatory view of the detection sensitivity characteristics of the electronic device according to the second embodiment.

FIGS. 7A and 7B are explanatory views of the current-voltage characteristics of the electronic device according to the second embodiment, and FIG. 8 is an explanatory view of the detection sensitivity characteristics of the electronic device according to the second embodiment.

FIG. 7A illustrates the current-voltage characteristics when the electronic device 1A (a, b, c) in which the graphene 10 is provided on the SAM film (insulation film 32) is placed in the air. FIG. 7A also illustrates the current-voltage characteristics when an electronic device (d, e) in which the graphene 10 is not provided on the SAM film is placed in the air for comparison. FIG. 7A illustrates a relationship between the back gate voltage $V_B$ [V] and the current $I_G$ [A] flowing in the graphene 10 when a voltage is applied to both ends of the graphene 10 and a back gate voltage is again applied to the semiconductor substrate 20 for the respective electronic devices a to e.

As illustrated in FIG. 7A, in the electronic device a, b, c (with the SAM film) in which the graphene 10 is provided on the SAM film, when it is placed in the air, the back gate voltage $V_B$ at which the current $I_G$ flowing in the graphene 10 is minimized is near 0 V. Meanwhile, in the electronic device d, e (without the SAM film) in which the graphene 10 is not provided on the SAM film, when it is placed in the air, the back gate voltage $V_B$ at which the current $I_G$ flowing in the graphene 10 is minimized shifts to a further positive voltage side. From this, it can be said that the graphene 10 of the electronic device d, e in which the graphene 10 is not provided on the SAM film is doped with holes in the air. Meanwhile, it can be said that, in the electronic device a, b, c in which the graphene 10 is provided on the SAM film, the SAM film causes electrons to be doped into the graphene 10 which is doped with holes in the air, and the graphene 10 is substantially not doped with charges or becomes a state close thereto.

In addition, FIG. 7B illustrates a relationship between the gate voltage $V_g$ [V] and the drain current $I_d$ [A] flowing between the source region 22 and the drain region 23 of the electronic device 1A (a, b, c) in which the graphene 10 is provided on the SAM film. FIG. 7B illustrates a relationship between the gate voltage $V_g$ [V] and the drain current $I_d$ [A] of the electronic device d in which the graphene 10 is not provided on the SAM film for comparison.

As illustrated in FIG. 7B, the characteristic curves of the electronic device a, b, c (with the SAM film) in which the graphene 10 is provided on the SAM film are shifted as compared with the characteristic curve of the electronic device d (without the SAM film) in which the graphene 10 is not provided on the SAM film. From this, it can be said that the work function of the graphene 10 changes when the graphene 10 is provided on the SAM film.

In addition, FIG. 8 illustrates the nitrogen dioxide detection sensitivity characteristics of the electronic device 1A (a, b, c) in which the graphene 10 is provided on the SAM film and the electronic device d in which the graphene 10 is not provided on the SAM film. Here, a change in the relative value of the drain current $I_d$ when nitrogen dioxide ($NO_2$) is introduced at a concentration of 7 ppb using the air as a carrier gas into a detection chamber in which each of the electronic devices a to d is disposed is obtained.

In FIG. 8, in the electronic device a, b, c (with the SAM film) in which the graphene 10 is provided on the SAM film, a change in the drain current Id increases due to the introduction of nitrogen dioxide, as compared with the electronic device d (without the SAM film) in which the graphene 10 is not provided on the SAM film. From this, it can be said that, according to the electronic device 1A in which the graphene 10 is provided on the SAM film, detection of nitrogen dioxide with higher sensitivity becomes possible.

Next, a gas sensor system (electronic apparatus) using the electronic device 1A will be described.

FIG. 9 is a view illustrating an exemplary gas sensor system using the electronic device according to the second embodiment.

The gas sensor system 200 illustrated in FIG. 9 includes the electronic device 1A and a detection chamber 210 in which the electronic device 1A is accommodated. The detection chamber 210 is provided with an introduction port 220 through which an external gas is introduced into the detection chamber 210 and a discharge port 230 through which the gas in the detection chamber 210 is discharged to the outside. A pump or fan (not illustrated) may be provided in front of the introduction port 220 of the detection chamber 210 to guide the external gas to the detection chamber 210. In a case of a person's exhalation, it is guided from the mouth to the detection chamber 210 by the force of respiration. In addition to the electronic device 1A, a temperature adjustment device 240 that adjusts the temperature of the electronic device 1A and a temperature and humidity monitor 250 that monitors the temperature and the humidity inside the detection chamber 210 are provided in the detection chamber 210.

Here, for example, a heater is used for the temperature adjustment device 240. Since the operational performance of the electronic device 1A is affected by the temperature of the electronic device 1A, by adjusting the temperature of the electronic device 1A to a certain temperature, for example, a temperature higher than room temperature using the temperature adjustment device 240, it is possible to reduce the influence of a change in the surrounding temperature and to realize a stable operation of the electronic device 1A. Increasing the temperature of the electronic device 1A also contributes to reducing the influence of humidity on the operational performance of the electronic device.

In addition, by increasing the temperature of the electronic device 1A using the temperature adjustment device 240 after detecting a detection target component using the electronic device 1A or during detection, the component adsorbed onto the graphene 10 may be removed. Such temperature adjustment using the temperature adjustment device 240 is incorporated, for example, in a measurement recipe in advance. The temperature adjustment range is, for example, about several hundreds of degrees from room temperature. In addition to the heater, light heating using, for example, a flash lamp may be adopted in temperature adjustment for the purpose of removing the adsorbed component from the graphene 10. In addition, the adsorbed component may be removed from the graphene 10 by irradiating the graphene 10 with ultraviolet light.

The temperature and the humidity inside the detection chamber 210 affect the operation performance and the detection sensitivity of the electronic device 1A. The temperature and humidity monitor 250 monitors the temperature and the humidity inside the detection chamber 210. For example, an operation of the temperature adjustment device 240 is controlled based on the monitoring result of the temperature and humidity monitor 250. A dehumidifier that dehumidifies the gas introduced into the detection chamber 210 or a humidifier that humidifies the gas may be provided in front of the introduction port 220 of the detection chamber 210. For example, an operation of such a dehumidifier or humidifier is controlled based on the monitoring result by the temperature and humidity monitor 250.

In the gas sensor system 200, a predetermined bias is applied to the gate electrode 40, the source electrode 50, and the drain electrode 60 of the electronic device 1A in the detection chamber 210. When detecting a detection target component, a predetermined bias (drain bias) is applied between the source electrode 50 and the drain electrode 60 by a bias power supply 260, and a predetermined bias (gate bias) is applied between the source electrode 50 and the gate electrode 40 by a bias power supply 270.

A current monitoring device (resistance monitoring device) 280 is connected between the source electrode 50 and the drain electrode 60 to detect a change (resistance change) in the drain current flowing between the source region 22 and the drain region 23. The current monitoring device 280 may include, for example, various power supplies, an amplification circuit, a sampling circuit, an analog-to-digital (AD) converter, and a data processing computer.

In addition, the bias power supply 260, the bias power supply 270, and the current monitoring device 280 may be provided in the gas sensor system 200, or may be provided outside the gas sensor system 200 and be connected to the electronic device 1A at the time of detection.

When performing detection by the gas sensor system 200 having the above-described configuration, an external gas which may include a detection target component, for example, the air or an exhalation which may contain, for example, nitrogen dioxide or ammonia, is introduced into the detection chamber 210 from the introduction port 220. A predetermined drain bias and a predetermined gate bias are applied to the electronic device 1A in the detection chamber 210 as described above. Oxygen contained in the air or the exhalation is adsorbed onto the graphene 10 of the electronic device 1A, but the influence of the adsorption of oxygen on detection sensitivity is suppressed by the SAM film (insulation film 32) provided under the graphene 10. When a detection target component is adsorbed onto the graphene 10, the work function of the graphene 10 changes due to charges doped into the graphene 10 by the adsorption, and the threshold voltage of the FET in which the graphene 10 is used as a gate changes. By detecting a change in the drain current under the predetermined drain bias and the predetermined gate bias by the current monitoring device 280, the detection target component (the presence or absence or the amount thereof) in the gas introduced into the detection chamber 210 is detected.

In addition, the detection by the gas sensor system 200 is performed, for example, on a gas that flows from the introduction port 220 of the detection chamber 210 toward the discharge port 230. In addition, the detection by the gas sensor system 200 may be performed in a state where the detection chamber 210 is sealed by closing the introduction port 220 and the discharge port 230 after the gas is introduced into the detection chamber 210 from the introduction port 220.

Next, a third embodiment will be described.

Figure 10A:
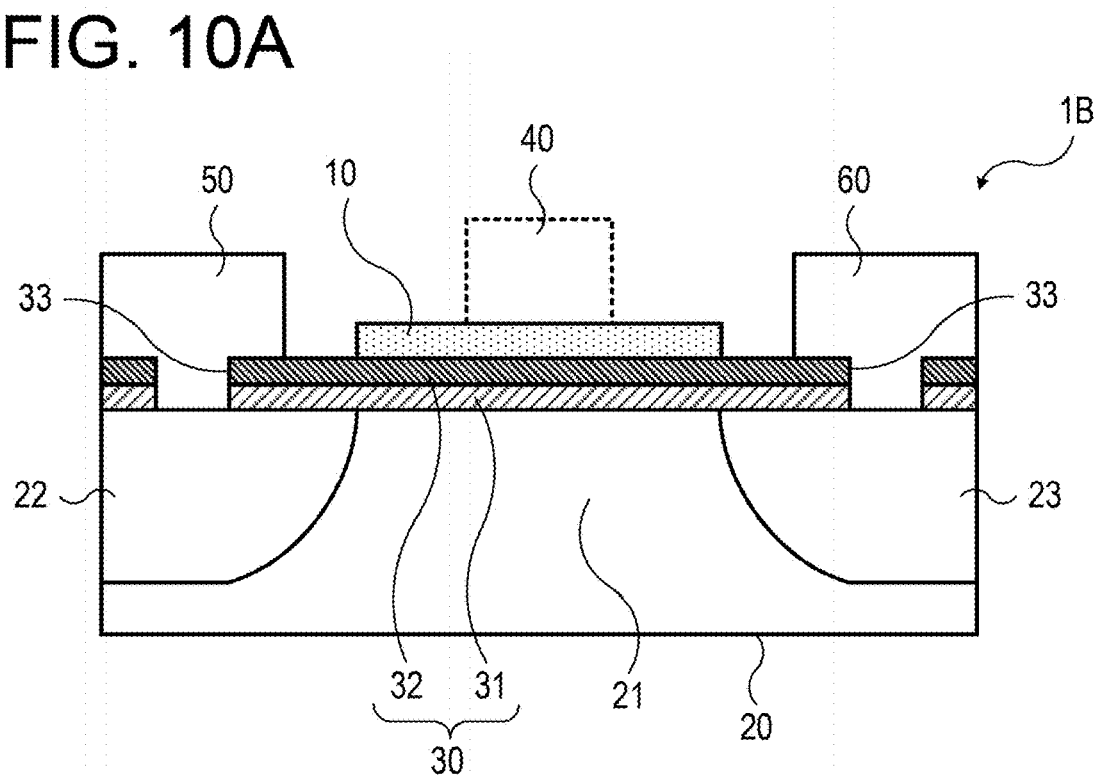
Figure 10B:
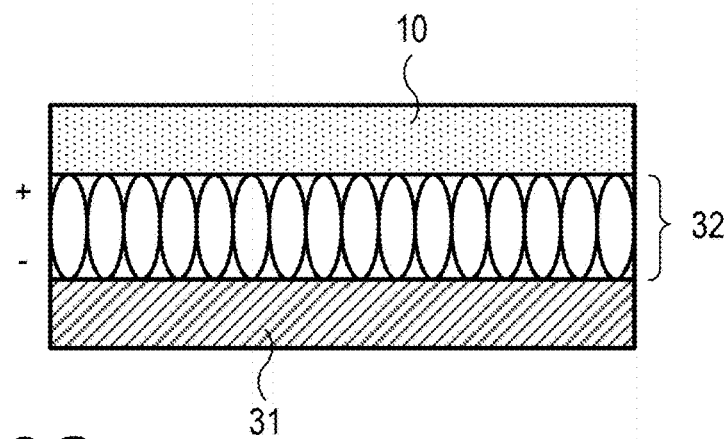
Figure 10C:
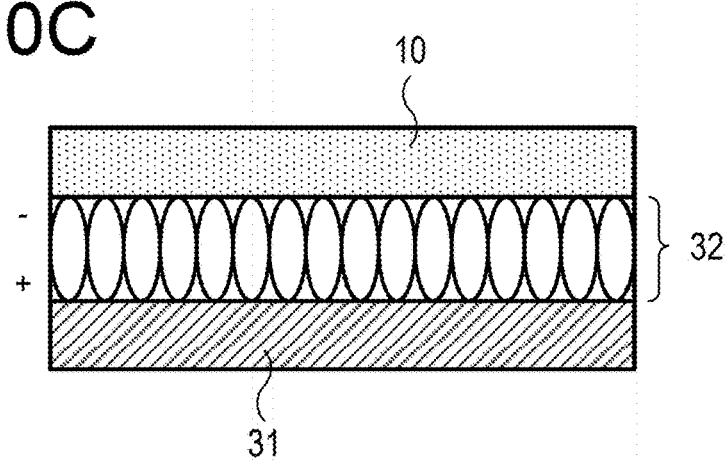

FIGS. 10A to 10C are views illustrating an exemplary electronic device according to a third embodiment. FIG. 10A schematically illustrates the cross section of a major portion of the electronic device. FIGS. 10B and 10C schematically illustrate the cross section of a major portion of a gate insulation film and a graphene in the electronic device, respectively.

The electronic device 1B illustrated in FIG. 10A is different from the device 1A described above in the second embodiment in that a ferroelectric film is provided as the insulation film 32 at the upper layer side of the gate insulation film 30 in contact with the graphene 10. In addition, in FIG. 10A, for the sake of convenience, the gate electrode 40 is indicated by a dotted line.

For example, barium titanate ($BaTiO_3$, BTO) is used for the ferroelectric film provided as the insulation film 32 of the electronic device 1B. In addition, a ferroelectric material such as, for example, lead zirconate titanate ($Pb(Zr, Ti)O_3$, PZT), lead lanthanum zirconate titanate ($(Pb, La)(Zr, Ti)O_3$, PLZT), lead zirconate titanate niobate ($Pb(Zr, Ti, Nb)O_3$, PZTN), lead nickelate niobate-lead titanate ($Pb(Ni, Nb)O_3$—$PbTiO_3$, PNN-PT), lead nickelate niobate-lead zirconate ($Pb(Ni, Nb)O_3$—$PbZrO_3$, PNN-PZ), lead magnesium niobate-lead titanate ($Pb(Mg, Nb)O_3$—$PbTiO_3$, PNN-PT), strontium bismuthate tantalate ($SrBi_2Ta_2O_9$, SBT), potassium sodium tantalate ($(K, Na)TaO_3$), potassium sodium niobate ($(K, Na)Nb_3$), bismuth ferrite ($BiFeO_3$), or bismuth neodymium lanthanum titanate ($Bi(Nd, La)TiO_x$) may be used for the ferroelectric film. The ferroelectric film may have a laminated structure other than a single layer structure.

For example, as illustrated in FIG. 10B, when the ferroelectric film using the above material as the insulation film 32 under the graphene 10 is polarized such that the graphene 10 side is positive (+), electrons are induced in the graphene 10. Therefore, the graphene 10 is doped with the electrons. In addition, as illustrated in FIG. 10C, when the ferroelectric film using the above material as the insulation film 32 under the graphene 10 is polarized such that the graphene 10 side is negative (−), holes are induced in the graphene 10. Therefore, the graphene 10 is doped with the holes.

The electronic device 1B is used, for example, as a gas sensor that detects a specific component in the atmosphere. For example, a gas sensor system using the electronic device 1B is realized according to the example of FIG. 9. When the electronic device 1B is used as a gas sensor, the polarity (the direction and amount of polarization) of the ferroelectric film provided as the insulation film 32 is adjusted according to the atmosphere in which the electronic device 1B is placed at the time of detection, so that the doping of charges (electrons or holes) in the graphene 10 is adjusted.

Next, a fourth embodiment will be described.

Figure 11:
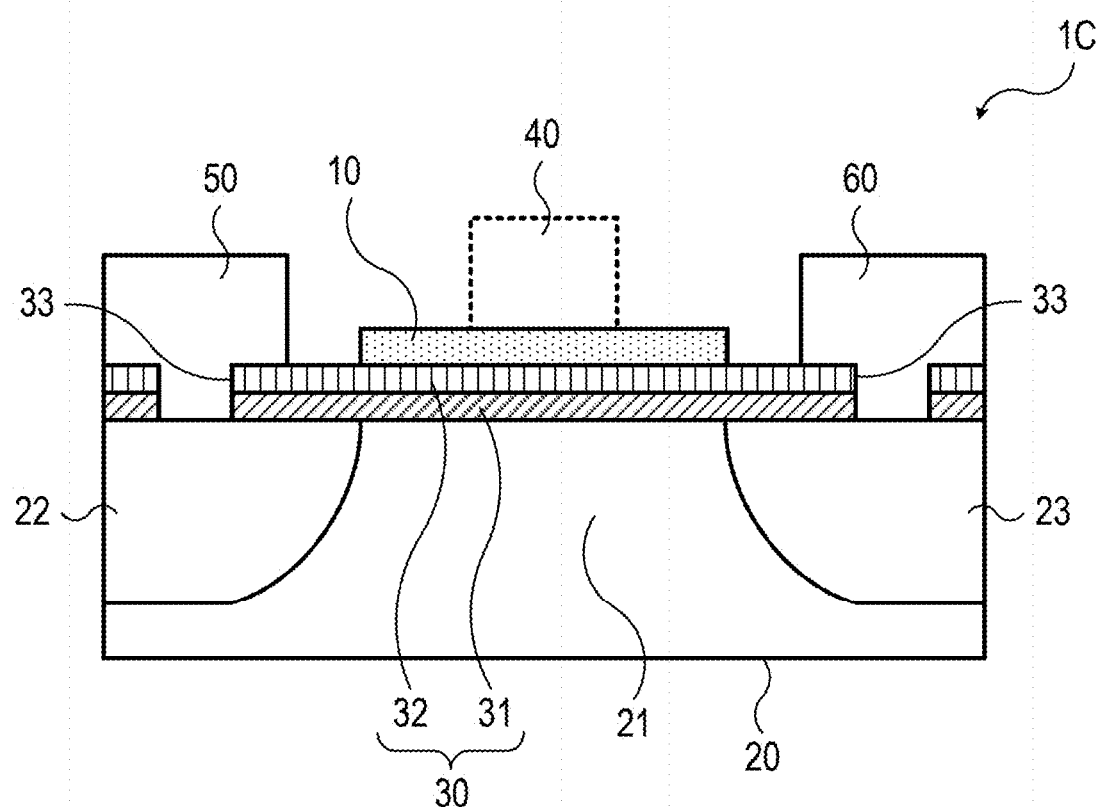
FIG. 11 is a view illustrating an exemplary electronic device according to a fourth embodiment.

FIG. 11 is a view illustrating an exemplary electronic device according to a fourth embodiment. FIG. 11 schematically illustrates the cross section of a major portion of the electronic device.

The electronic device 1C illustrated in FIG. 11 is different from the electronic device 1A described above in the second embodiment in that a film using at least one of ferrocene, cobaltocene, and polyetherimide (PEI) is provided as the insulation film 32 at the upper layer side of the gate insulation film 30 in contact with the graphene 10. In addition, in FIG. 11, for the sake of convenience, the gate electrode 40 is indicated by a dotted line.

All of ferrocene, cobaltocene, and PEI used for the insulation film 32 of the electronic device 1C act such that electrons are doped into the graphene 10. For example, ferrocene, cobaltocene, and PEI donate electrons to the graphene 10 by interaction with the graphene 10, thereby doping the graphene 10 with electrons. Ferrocene, cobaltocene, and PEI are deposited, for example, on the insulation film 31 at the lower layer side of the gate insulation film 30 by a vacuum deposition method. Ferrocene, cobaltocene, and PEI may be unstable according to the surrounding atmosphere, but in the electronic device 1C, deterioration thereof is suppressed since the surface of the insulation film 32 using them is covered with the graphene 10.

The electronic device 1C is used, for example, as a gas sensor that detects a specific component in the atmosphere. For example, a gas sensor system using the electronic device 1C is realized according to the example of FIG. 9. Even when the electronic device 1C is used as a gas sensor and a component that is adsorbed onto the graphene 10 and causes the graphene 10 to be doped with holes is contained as a component other than a detection target in the atmosphere in which the electronic device 1C is placed at the time of detection, deterioration in the detection sensitivity of the detection target component is suppressed by the insulation film 32 formed of the above material.

Next, a fifth embodiment will be described.

Figure 12:
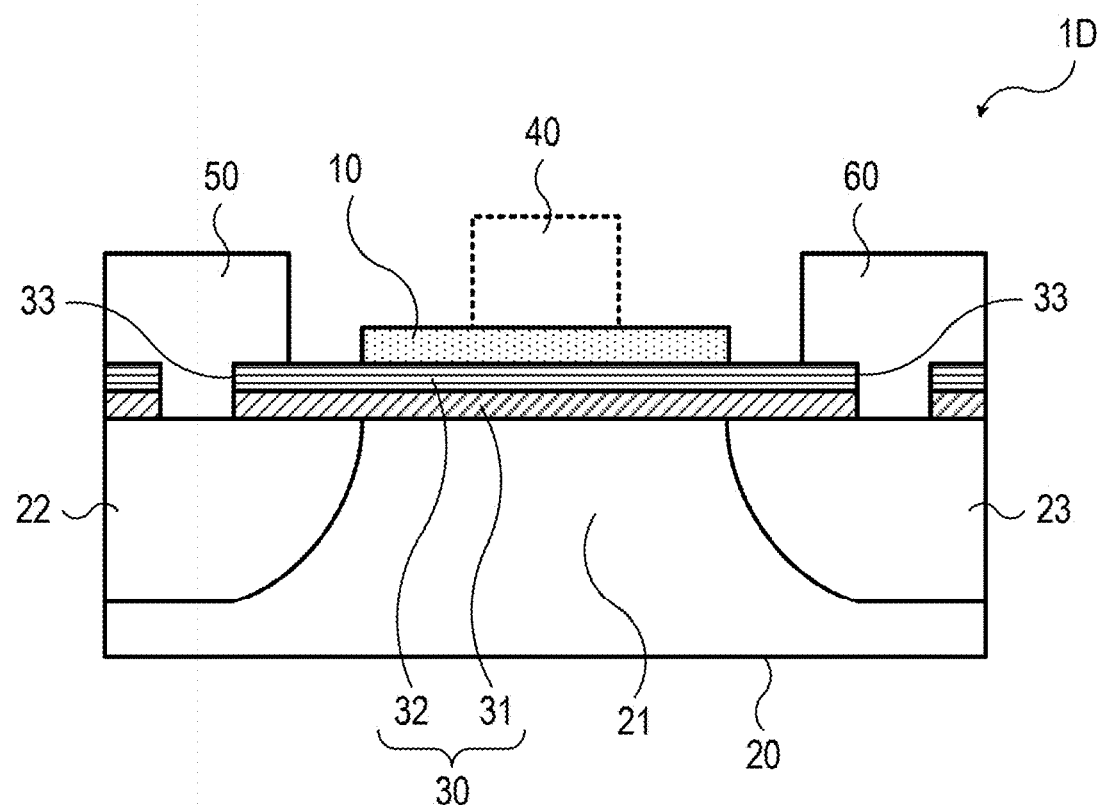
FIG. 12 is a view illustrating an exemplary electronic device according to a fifth embodiment.

FIG. 12 is a view illustrating an exemplary electronic device according to a fifth embodiment. FIG. 12 schematically illustrates the cross section of a major portion of the electronic device.

The electronic device 1D illustrated in FIG. 12 is different from the electronic device 1A described in the second embodiment in that a film using at least one of tetracyanoquinodimethane (TCNQ) and tetracyanoquinodimethane, hydrogen atoms of which are replaced with fluorine (e.g., F4-TCNQ) is provided as the insulation film 32 at the upper layer side of the gate insulation film 30 in contact with the graphene 10. In addition, in FIG. 12, for the sake of convenience, the gate electrode 40 is indicated by a dotted line.

All of TCNQ and F4-TCNQ, for example, used for the insulation film 32 of the electronic device 1D act such that holes are doped in the graphene 10. For example, TCNQ and F4-TCNQ attract electrons of the graphene 10 by interaction with the graphene 10, thereby doping the graphene 10 with holes. TCNQ and F4-TCNQ are deposited, for example, on the insulation film 31 at the lower layer side of the gate insulation film 30 by, for example, vacuum deposition or spin coating.

The electronic device 1D is used, for example, as a gas sensor that detects a specific component in the atmosphere. For example, a gas sensor system using the electronic device 1D is realized according to the example of FIG. 9. Even when the electronic device 1D is used as a gas sensor and a component that is adsorbed onto the graphene 10 and causes the graphene 10 to be doped with electrons is contained as a component other than a detection target in the atmosphere in which the electronic device 1D is placed at the time of detection, deterioration in the detection sensitivity of a detection target component is suppressed by the insulation film 32 formed of the above material.

Next, a sixth embodiment will be described.

Figure 13:
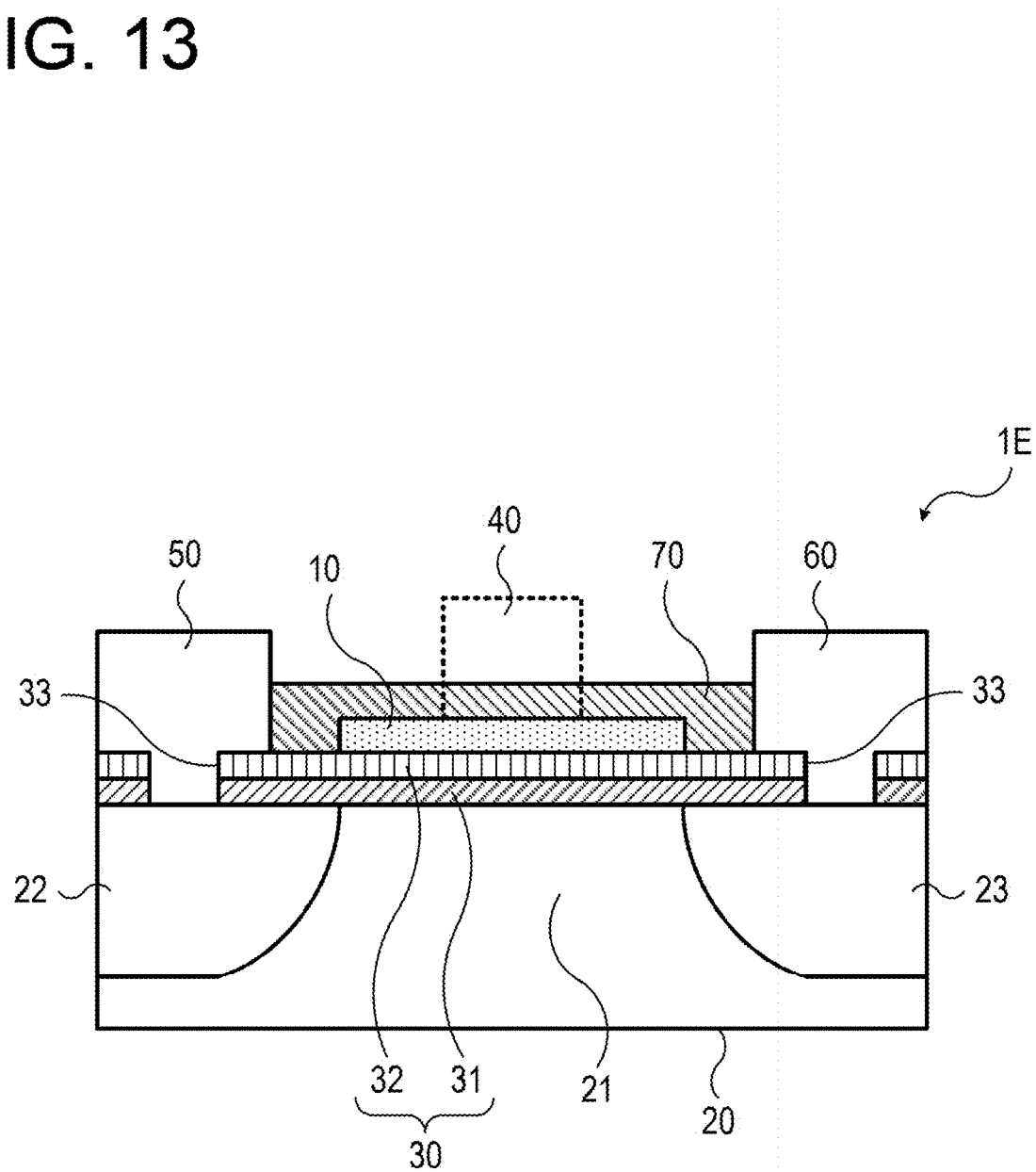
FIG. 13 is a view illustrating an exemplary electronic device according to a sixth embodiment.

FIG. 13 is a view illustrating an exemplary electronic device according to a sixth embodiment. FIG. 13 schematically illustrates the cross section of a major portion of the electronic device.

The electronic device 1E illustrated in FIG. 13 is different from the electronic device 1A described in the second embodiment in terms of a structure in that a protective film 70 that covers the graphene 10 is provided. In addition, in FIG. 13, for the sake of convenience, the gate electrode 40 is indicated by a dotted line. The electronic device 1E is used, for example, as a switching element that controls an on/off operation in an electronic circuit.

For example, the SAM film described in the second embodiment is used for the insulation film 32 (at the upper layer side of the gate insulation film 30) provided under the graphene 10 of the electronic device 1E. In addition, the ferroelectric film described in the third embodiment, or the ferrocene, cobaltocene, PEI, TCNQ, or F4-TCNQ film, for example, described in the fourth and fifth embodiments may be used for the insulation film 32 of the electronic device 1E.

In the electronic device 1E, by selecting the material type of the insulation film 32, the doping of charges (electrons or holes) in the graphene 10 provided on the insulation film 32 is adjusted, and the work function of the graphene 10 is adjusted. When the work function of the graphene 10 is adjusted by the insulation film 32, the threshold voltage of the gate (graphene 10) is adjusted, and the switching characteristics are adjusted.

In the electronic device 1E, adsorption of a component in the atmosphere in which the electronic device 1E is placed to the graphene 10 is suppressed by the protective film 70, and a change in the work function of the graphene 10 due to the adsorption of the component in the atmosphere, and a change in the threshold voltage and a change in the switching characteristic depending on the change in the work function are suppressed. Various insulation materials are used for the protective film 70, and for example, spin on glass (SOG) or hexagonal boron nitride (BN) is used.

In addition, the electronic device 1B (FIG. 10A), the electronic device 1C (FIG. 11), and the electronic device 1D (FIG. 12) described in the third to fifth embodiments may also be provided with the protective film 70 covering the graphene 10 as described above, and may be used as a switching element.

Next, a seventh embodiment will be described.

Figure 14:
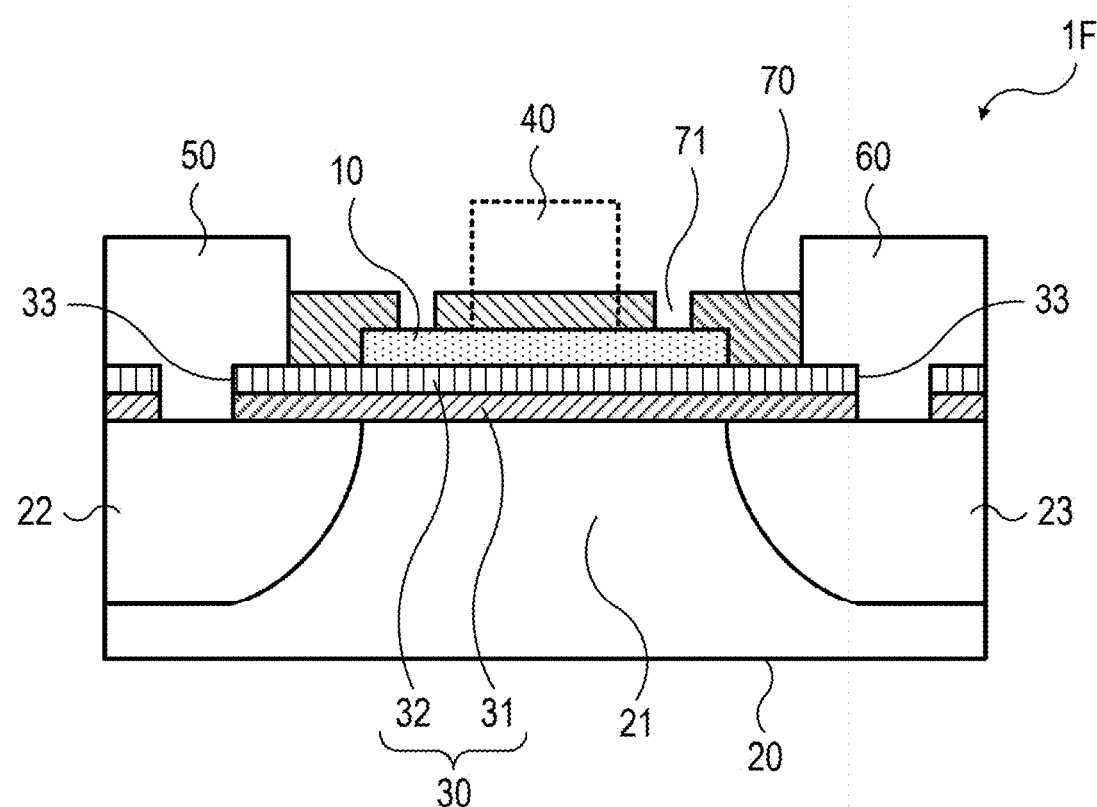
FIG. 14 is a view illustrating an exemplary electronic device according to a seventh embodiment.

FIG. 14 is a view illustrating an exemplary electronic device according to a seventh embodiment. FIG. 14 schematically illustrates the cross section of a major portion of the electronic device.

The electronic device 1F illustrated in FIG. 14 is different from the electronic device 1E described in the sixth embodiment in terms of a structure in that the protective film 70 covering the graphene 10 is provided and an opening 71 that reaches the graphene 10 is provided in the protective film 70. In addition, in FIG. 14, for the sake of convenience, the gate electrode 40 is indicated by a dotted line.

The electronic device 1F is used, for example, as a gas sensor. In this case, adsorption of a detection target component contained in the atmosphere in which the electronic device 1F is placed at the time of detection to the graphene 10 is performed through the opening 71 provided in the protective film 70. In the electronic device 1F, the influence of the adsorption of a component other than a detection target in the atmosphere in which the electronic device 1F is placed to the graphene 10 is suppressed by the insulation film 32 under the graphene 10, thereby suppressing deterioration in the detection sensitivity of the detection target component is.

In addition, the electronic device 1B (FIG. 10A), the electronic device 1C (FIG. 11), and the electronic device 1D (FIG. 12) described in the third to fifth embodiments may also be provided with the protective film 70 having the opening 71 which covers the graphene 10.

Next, an eighth embodiment will be described.

In the first to seventh embodiments, an example in which a channel region of an FET is realized by the semiconductor substrate 20 is described, but the disclosure is not limited thereto, and various films may be used as the material of the channel region of the FET. As such a film, for example, an amorphous silicon film, a polysilicon film, a film (IGZO film) containing indium (In)-gallium (Ga)-zinc (Zn)-oxygen (O), a zinc oxide (ZnO) film, or a transition metal diechalcogenide film may be provided. Here, as an example, an electronic device using transition metal dichalcogenide as the material of the FET channel region will be described as an eighth embodiment.

Figure 15:
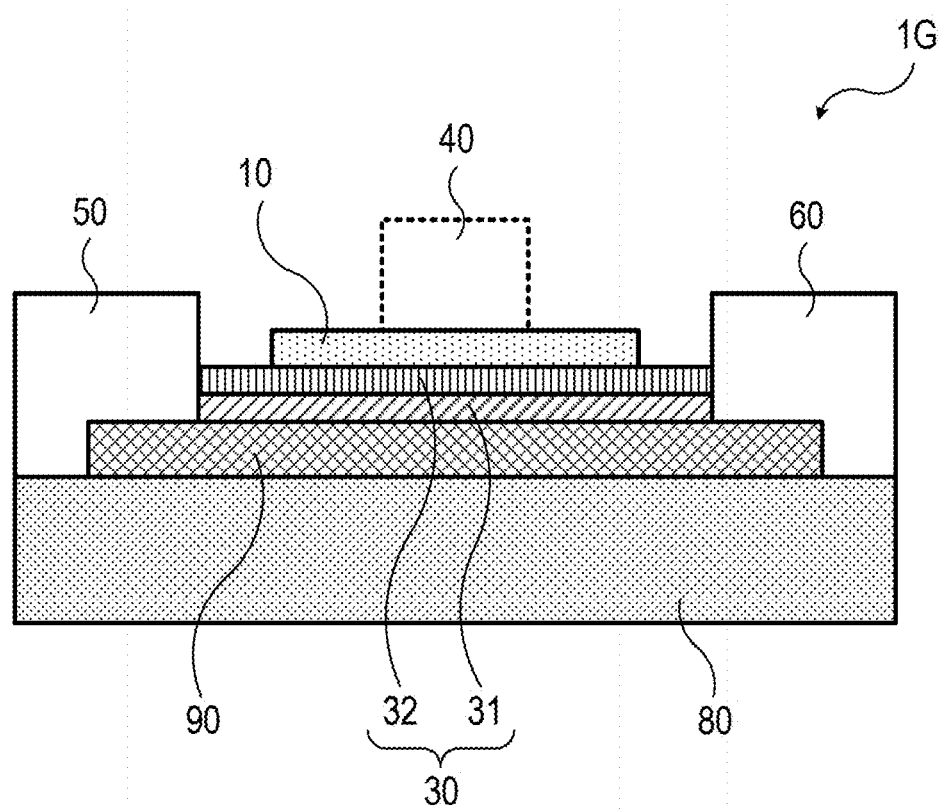
FIG. 15 is a view illustrating an exemplary electronic device according to an eighth embodiment.

FIG. 15 is a view illustrating an exemplary electronic device according to an eighth embodiment. FIG. 15 schematically illustrates the cross section of a major portion of the electronic device.

The electronic device 1G illustrated in FIG. 15 has a configuration in which transition metal dichalcogenide ($MX_2$, M: transition metal, X: chalcogen atom) is used as the material of the channel region of the FET in which the graphene 10 is used as a gate.

The electronic device 1G includes an insulation substrate 80, a semiconductor layer 90, the gate insulation film 30, the graphene 10, the gate electrode 40, the source electrode 50, and the drain electrode 60.

Transition metal dichalcogenide such as, for example, molybdenum disulfide ($MoS_2$) is used for the semiconductor layer 90. The source electrode 50 and the drain electrode 60 are respectively connected to both opposing ends of the semiconductor layer 90. The semiconductor layer 90 between the source electrode 50 and the drain electrode 60 functions as the channel region of the FET.

The gate insulation film 30 includes the insulation film 31 provided at the lower layer side (the semiconductor layer 90 side) and the insulation film 32 provided so as to be in contact with the graphene 10 at the upper layer side (the graphene 10 side). For example, aluminum oxide, hafnium oxide, or silicon oxide is used for the insulation film 31 at the lower layer side. The insulation film 31 may have a laminated structure of two or more layers of insulation films using the same or different insulation materials. In addition, for example, the SAM film described in the second embodiment is used for the insulation film 32 at the upper layer side. In addition, the ferroelectric film described in the third embodiment or, for example, the ferrocene, cobaltocene, PEI, TCNQ, or F4-TCNQ film described in the fourth and fifth embodiments may be used for the insulation film 32.

The graphene 10 on the insulation film 32 is connected to the gate electrode 40 provided at a position at which the graphene 10 does not overlap the channel region of the semiconductor layer 90. In addition, in FIG. 15, for the sake of convenience, the gate electrode 40 is indicated by a dotted line.

The electronic device 1G having the above configuration is used, for example, as a gas sensor that detects a specific component in the atmosphere. For example, a gas sensor system using the electronic device 1G is realized according to the example of FIG. 9. In the electronic device 1G used as a gas sensor, a detection target component in the atmosphere in which the electronic device 1G is placed is adsorbed onto the graphene 10, so that the work function of the graphene 10 changes and the threshold voltage of the FET in which the graphene 10 is used as a gate changes. Detection of the detection target component in the atmosphere is performed by detecting a change in the drain current flowing in the semiconductor layer 90 (channel region) under a predetermined drain bias and a predetermined gate bias. The influence of adsorption of a component other than a detection target in the atmosphere to the graphene 10 is suppressed by the insulation film 32 under the graphene 10, thereby suppressing deterioration in the detection sensitivity of the detection target component.

The method of providing the insulation film 32 which induces the doping of charges under the graphene 10 may be similarly applied to the FET using the transition metal dichalcogenide as the material of the channel region like the electronic device 1G.

The electronic device 1G having the above-described configuration is formed, for example, as follows.

FIGS. 16A to 16C and FIGS. 17A and 17B are views illustrating an exemplary method of forming the electronic device according to the eighth embodiment. FIGS. 16A to 16C and FIGS. 17A and 17B schematically illustrate the cross section of a major portion in each step of forming the electronic device.

Figure 16A:
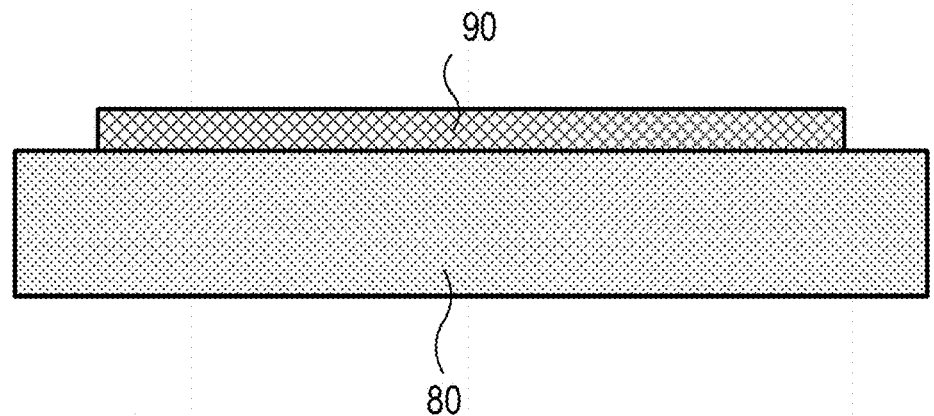
FIGS. 16A to 16C are views illustrating an exemplary method of forming the electronic device according to the eighth embodiment.

First, as illustrated in FIG. 16A, the semiconductor layer 90 using transition metal dichalcogenide such as, for example, molybdenum disulfide is formed on the insulation substrate 80. The semiconductor layer 90 is formed on the insulation substrate 80 by, for example, a transfer method.

For example, in a case where molybdenum disulfide is used for the semiconductor layer 90, molybdenum disulfide formed by a CVD method is transferred onto the insulation substrate 80. In the formation of molybdenum disulfide by the CVD method, c-plane sapphire (alumina) is used for a substrate, and the substrate is placed in a tubular furnace in the argon atmosphere. In a state where an argon gas as a carrier gas is continuously introduced into the tubular furnace at about 500 sccm, the temperature of the substrate is set to 800° C., the temperature of molybdenum trioxide ($MoO_3$) (10 mg) disposed upstream of the substrate is set to 600° C., and the temperature of sulfur (S) (500 mg) disposed upstream of the substrate is set to 160° C., and this state is held for 20 minutes. Therefore, molybdenum disulfide is synthesized on the substrate. Subsequently, the molybdenum disulfide formed on the substrate is transferred onto the insulation substrate 80 using, for example, a polymer film as a support film. The transferred molybdenum disulfide is patterned using a photolithography technique and an etching technique. For example, molybdenum disulfide is etched by RIE using, for example, carbon tetrafluoride ($CF_4$), sulfur hexafluoride ($SF_6$), $O_2$, or xenon fluoride ($XeF_2$). For example, according to such a method, molybdenum disulfide having a predetermined pattern shape is formed as an example of the semiconductor layer 90 on the insulation substrate 80.

Figure 16B:
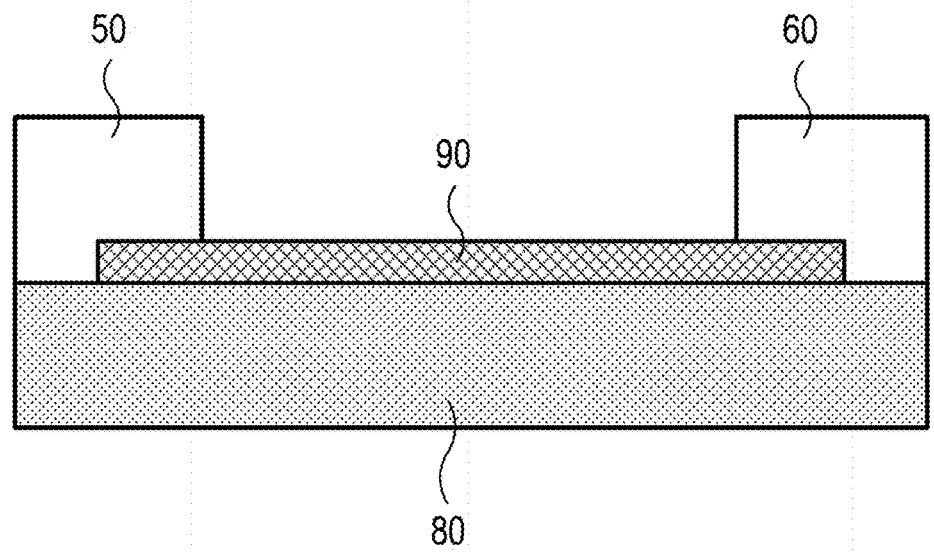

Subsequently, as illustrated in FIG. 16B, the source electrode 50 and the drain electrode 60 are formed so as to be connected to both opposed end portions of the semiconductor layer 90 on the insulation substrate 80. In the formation of the source electrode 50 and the drain electrode 60, for example, a lift-off method is used.

In a case where molybdenum disulfide is formed as the semiconductor layer 90, for example, a resist is applied onto the insulation substrate 80 on which molybdenum disulfide is formed, and openings are formed in regions of the resist in which the source electrode 50 and the drain electrode 60 are formed by a photolithography technique. Subsequently, an adhesive material and an electrode material are continuously deposited on the resist including the inside of the openings. As the adhesive material, for example, any one of titanium, chromium (Cr), and nickel (Ni), for example, titanium is deposited to a thickness of about 1 nm. As an electrode material, any one of gold, silver (Ag), aluminum (Al), platinum (Pt), copper, iridium (Ir), and palladium (Pd), for example, gold is deposited to a thickness of about 5 nm. Thereafter, by a lift-off method, the resist is removed together with the adhesive material and the electrode material formed thereon. For example, according to such a method, the source electrode 50 and the drain electrode 60 connected to both end portions of molybdenum disulfide which is an example of the semiconductor layer 90 are formed on the insulation substrate 80.

Figure 16C:
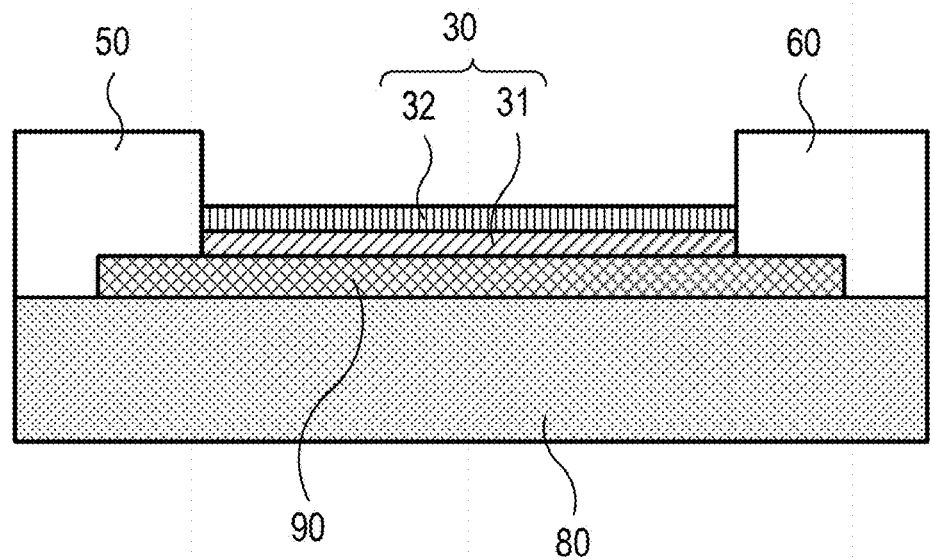

Subsequently, as illustrated in FIG. 16C, the insulation film 31 at the lower layer side and the insulation film 32 at the upper layer side are formed as the gate insulation film 30 on the semiconductor layer 90 exposed between the source electrode 50 and the drain electrode 60. The insulation film 31 is formed by, for example, an ALD method or a CVD method. For example, aluminum oxide having a thickness of about 5 nm is formed as the insulation film 31. The insulation film 32 is formed by the method as described in the second to fifth embodiments according to the SAM film and the material used therein. An unnecessary portion of the laminated structure of the insulation film 31 and the insulation film 32 formed as described above is removed by a photolithography technique and an etching technique.

Figure 17A:
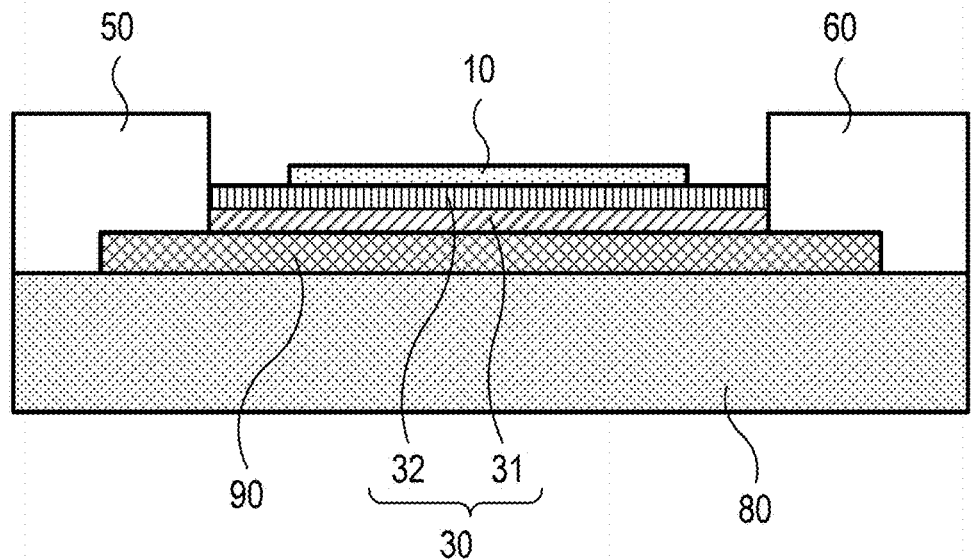
FIGS. 17A to 17B are views illustrating the exemplary method of forming the electronic device according to the eighth embodiment.

Subsequently, as illustrated in FIG. 17A, the graphene 10 is formed on the gate insulation film 30 (insulation film 32 thereof). The graphene 10 is formed, for example, by a transfer method described in the second embodiment, that is, a technique of transferring the separately formed graphene 10 onto the insulation film 32.

Figure 17B:
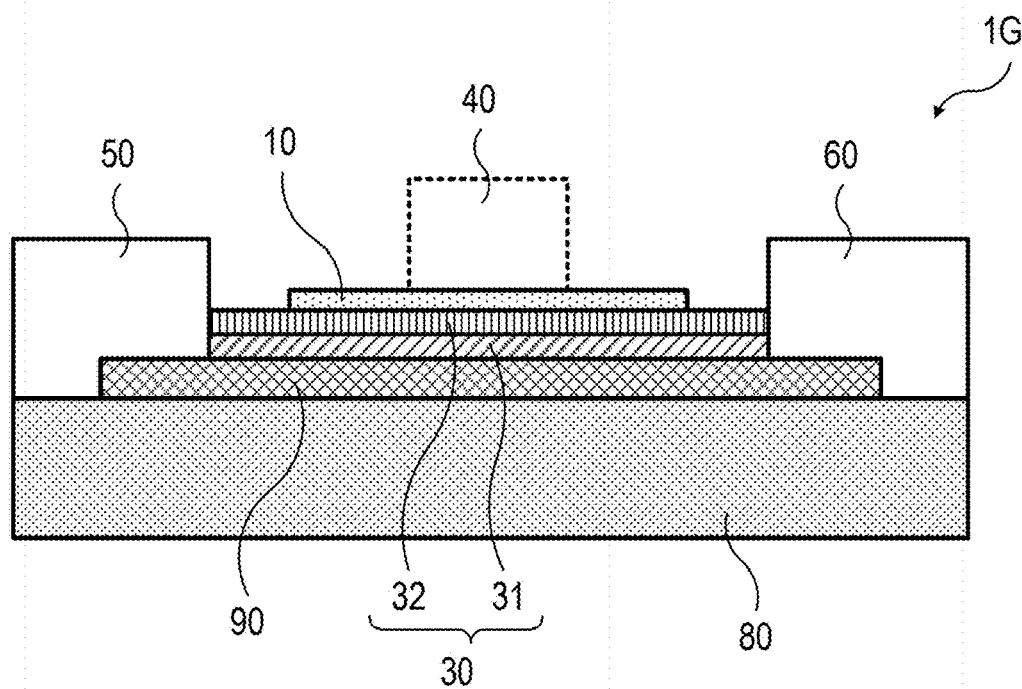

Thereafter, as illustrated in FIG. 17B, the gate electrode 40 is formed so as to be connected to the graphene 10 at a position at which it does not overlap the channel region of the semiconductor layer 90 between the source electrode 50 and the drain electrode 60. In the same manner as the source electrode 50 and the drain electrode 60, for example, the gate electrode 40 is formed by a lift-off method of depositing titanium as an adhesive material and gold as an electrode material after forming a resist having openings and removing the resist together with the adhesive material and the electrode material formed thereon.

As described above, the electronic device 1G is formed by the method as illustrated in FIGS. 16A to 16C and FIGS. 17A and 17B.

Next, a ninth embodiment will be described.

Figure 18:
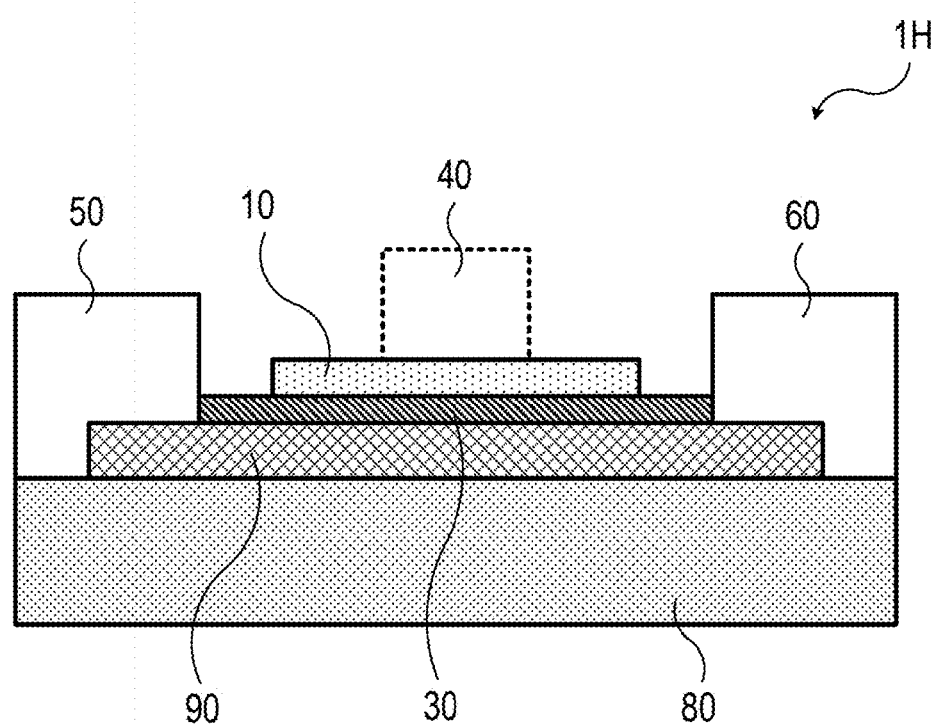
FIG. 18 is a view illustrating an exemplary electronic device according to a ninth embodiment.

FIG. 18 is a view illustrating an exemplary electronic device according to a ninth embodiment. FIG. 18 schematically illustrates the cross section of a major portion of the electronic device.

The electronic device 1H illustrated in FIG. 18 is different from the electronic device 1G described in the eighth embodiment in that a ferroelectric film is provided as the gate insulation film 30.

For the ferroelectric film provided as the gate insulation film 30 of the electronic device 1H, one or more kinds of ferroelectric materials such as BTO as described in the third embodiment are used. The ferroelectric film provided as the gate insulation film 30 may have a laminated structure in addition to a single layer structure. The ferroelectric film is formed directly on the semiconductor layer 90 using transition metal dichalcogenide such as molybdenum disulfide. The electronic device 1H is formed using the same method as the electronic device 1G described in the eighth embodiment, except that the ferroelectric film as the gate insulation film 30 is directly provided on the semiconductor layer 90.

In the electronic device 1H, when the ferroelectric film provided as the insulation film 32 under the graphene 10 is polarized such that the graphene 10 side is positive, electrons are induced in the graphene 10, and the graphene 10 is doped with the electrons. In addition, in the electronic device 1H, when the ferroelectric film provided as the insulation film 32 under the graphene 10 is polarized such that the graphene 10 side is negative, holes are induced in the graphene 10, and the graphene 10 is doped with the holes.

The electronic device 1H is used, for example, as a gas sensor that detects a specific component in the atmosphere. For example, a gas sensor system using the electronic device 1H is realized according to the example of FIG. 9. When the electronic device 1H is used as a gas sensor, the polarity (the direction and amount of polarization) of the ferroelectric film provided as the insulation film 32 is adjusted according to the atmosphere in which the electronic device 1H is placed at the time of detection, thereby adjusting the doping of charges (electrons or holes) in the graphene 10.

In addition, the electronic device 1G (FIG. 15) and the electronic device 1H (FIG. 18) described in the eighth and ninth embodiments may be provided with a protective film that covers the graphene 10 and may be used as a switching element. In the electronic device 1G and the electronic device 1H used as a switching element, the work function of the graphene 10 is adjusted by the insulation film 32, so that the threshold voltage of the gate is adjusted and the switching characteristics are adjusted.

Next, a tenth embodiment will be described.

When the electronic devices 1 and 1A to 1G described in the first to ninth embodiments are used as a switching element, these electronic devices may be mounted in various electronic apparatuses. For example, these electronic devices may be mounted in various electronic apparatuses such as computers (e.g., personal computers, super computers, and servers), smart phones, mobile phones, tablet terminals, sensors, cameras, audio devices, measuring devices, inspection devices, and manufacturing devices.

Figure 19:
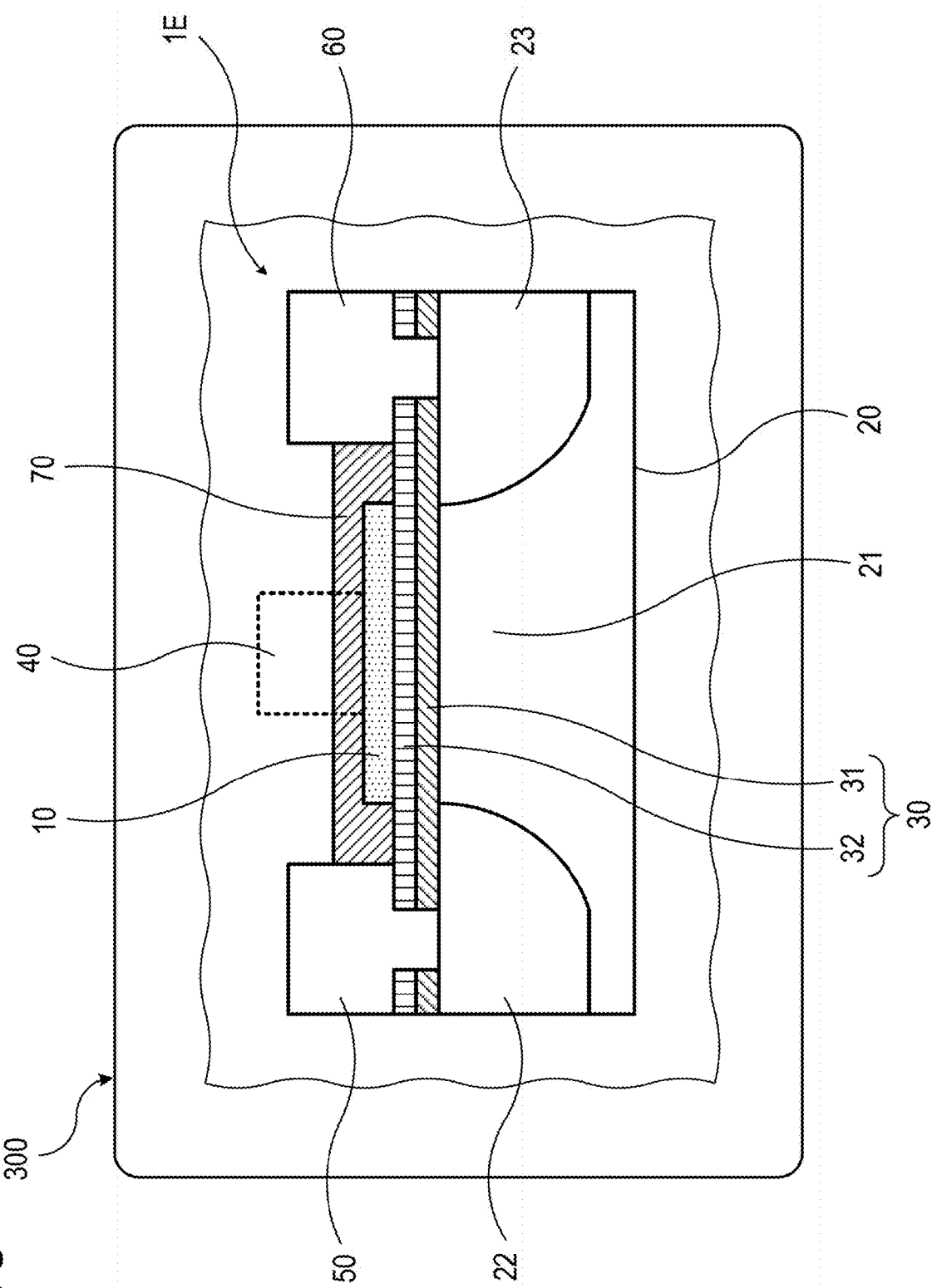
FIG. 19 is an explanatory view of an electronic apparatus according to a tenth embodiment.

FIG. 19 is an explanatory view of an electronic apparatus according to a tenth embodiment. FIG. 19 schematically illustrates the electronic apparatus.

As illustrated in FIG. 19, for example, the electronic device 1E (FIG. 13) described in the sixth embodiment is mounted (built-in) in any of various electronic apparatuses 300. In the electronic device 1E, the insulation film 32 at the upper layer side of the gate insulation film 30 induces the doping of charges in the graphene 10 provided in contact therewith. When the work function of the graphene 10 is adjusted by the insulation film 32 using a predetermined material, the threshold voltage of the gate is adjusted and the switching characteristics are adjusted. Therefore, the electronic device 1E having high device performance suitable for the application is realized, and any of various high-performance electronic apparatuses 300 equipped with such an electronic device 1E is realized.

Here, the electronic apparatus 300 equipped with the electronic device 1E described in the sixth embodiment is illustrated as an example. In addition, the electronic devices 1, 1A to 1D, 1F and 1G described in the first to fifth embodiments and the seventh to ninth embodiments may also be mounted in various electronic apparatuses in the same manner.

In addition, when the electronic devices 1 and 1A to 1G described in the first to ninth embodiments are used as a gas sensor, a gas sensor system realized using the electronic devices 1 and 1A to 1G may be mounted in various electronic apparatuses as described above.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:
1. An electronic device comprising:
a semiconductor layer;
a source region and a drain region provided with the semiconductor layer to be interposed therebetween;
a gate insulation film on the semiconductor layer between the source region and the drain region, the gate insulation film configured to induce doping of charges in a graphene;
a source electrode which is provided over the gate insulation film which overlies the source region and is not in contact with the graphene;
a drain electrode which is provided over the gate insulation film which overlies the drain region and is not in contact with the graphene; and
a gate of the graphene over the gate insulation film.

2. The electronic device according to claim 1, wherein the gate insulation film includes:
   a first insulation film on the semiconductor layer; and
   a second insulation film on the first insulation film, configured to be in contact with the graphene, wherein the second insulation film induces the doping of charges in the graphene.

3. The electronic device according to claim 1, wherein the gate insulation film has a polarity, and induces the doping of charges in the graphene by generating charges corresponding to the polarity in the graphene.

4. The electronic device according to claim 1, wherein the gate insulation film induces the doping of charges in the graphene by donating charges to the graphene or by attracting charges from the graphene.

5. The electronic device according to claim 1, wherein, when the gate insulation film is disposed in an atmosphere containing a first substance and a second substance that is different from the first substance, the gate insulation film induces the doping of charges opposite to charges generated, in the graphene, when one of the first substance and the second substance is adsorbed onto the graphene.

6. The electronic device according to claim 1, further comprising:
   a protective film configured to cover the graphene.

7. An electronic apparatus comprising:
   an electronic device including:
   a semiconductor layer;
   a source region and a drain region provided with the semiconductor layer to be interposed therebetween;
   a gate insulation film on the semiconductor layer between the source region and the drain region, the gate insulation film configured to induce doping of charges in a graphene;
   a source electrode which is provided over the gate insulation film which overlies the source region and is not in contact with the graphene;
   a drain electrode which is provided over the gate insulation film which overlies the drain region and is not in contact with the graphene; and
   a gate of the graphene over the gate insulation film, and peripheral circuitry coupled to the electronic device.

8. A manufacturing method for an electronic device comprising:
   forming a source region and a drain region apart from each other in a semiconductor layer;
   forming a gate insulation film on the semiconductor layer between the source region and the drain region, the gate insulation film configured to induce doping of charges in a graphene;
   forming a source electrode over the gate insulation film which overlies the source region in such a manner that the source electrode is not in contact with the graphene;
   forming a drain electrode which is provided over the gate insulation film which overlies the drain region in such a manner that the drain electrode is not in contact with the graphene; and
   forming a gate of the graphene over the gate insulation film.

9. The method according to claim 8, wherein the gate insulation film includes a first insulation film on the semiconductor layer and a second insulation film on the first insulation film, and the second insulation film is configured to induce doping of charges in the graphene.

10. The method according to claim 8, wherein the gate insulation film has a polarity, and induces the doping of charges in the graphene by generating charges corresponding to the polarity in the graphene.

11. The method according to claim 8, wherein the gate insulation film induces the doping of charges in the graphene by donating charges to the graphene or by attracting charges from the graphene.

12. The method according to claim 8, further comprising forming a protective film on the graphene.

* * * * *